(12) United States Patent
Liu et al.

(10) Patent No.: US 12,219,709 B2
(45) Date of Patent: Feb. 4, 2025

(54) FORMING TRENCH IN IC CHIP THROUGH MULTIPLE TRENCH FORMATION AND DEPOSITION PROCESSES

(71) Applicant: Taiwan Semiconductor Manufacturing Company, Ltd., Hsin-Chu (TW)

(72) Inventors: Kao-Chih Liu, Changhua County (TW); Wenmin Hsu, Hsinchu (TW); Yu-Ting Lin, Hsin-Chu (TW); Chia Hong Lin, Hsinchu County (TW); ChienYi Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 120 days.

(21) Appl. No.: 18/191,787

(22) Filed: Mar. 28, 2023

(65) Prior Publication Data

US 2024/0040701 A1    Feb. 1, 2024

Related U.S. Application Data

(60) Provisional application No. 63/393,556, filed on Jul. 29, 2022, provisional application No. 63/409,045, filed on Sep. 22, 2022.

(51) Int. Cl.
*H05K 1/18* (2006.01)
*G01R 31/28* (2006.01)
(Continued)

(52) U.S. Cl.
CPC .......... *H05K 1/18* (2013.01); *G01R 31/2896* (2013.01); *H01L 23/5226* (2013.01);
(Continued)

(58) Field of Classification Search
CPC .......... H05K 1/18; H05K 2201/09036; G01R 31/2896; H01L 23/5226; H01L 24/16; H01L 2224/16227; H01L 2224/16225
See application file for complete search history.

(56) References Cited

U.S. PATENT DOCUMENTS

| 8,802,504 B1 | 8/2014 | Hou et al. |
| 8,803,292 B2 | 8/2014 | Chen et al. |

(Continued)

FOREIGN PATENT DOCUMENTS

| TW | 201411138 A | 3/2014 |
| TW | 201448692 A | 12/2014 |

(Continued)

*Primary Examiner* — Alvaro E Fortich
(74) *Attorney, Agent, or Firm* — HAYNES AND BOONE, LLP

(57) ABSTRACT

An integrated circuit (IC) chip assembly includes an integrated circuit (IC) die that includes a first substrate in which plurality of transistors is formed, a first structure that contains a plurality of first metallization components, and a second structure that contains a plurality of second metallization components. The first structure is disposed over a first side of the first substrate. The second structure is disposed over a second side of the first substrate opposite the first side. The chip assembly includes a second substrate bonded to the IC die through the second side. The chip assembly includes a trench that extends through the second substrate and through the second structure of the IC die. Sidewalls of the trench are defined at least in part by one or more protective layers.

20 Claims, 19 Drawing Sheets

(51) Int. Cl.
  *H01L 23/522* (2006.01)
  *H01L 23/00* (2006.01)
(52) U.S. Cl.
  CPC .... *H01L 24/16* (2013.01); *H01L 2224/16227* (2013.01); *H05K 2201/09036* (2013.01)

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2012/0034760 A1* | 2/2012 | Schuderer ............... H01L 21/78 257/E21.599 |
| 2016/0276383 A1* | 9/2016 | Chuang ............. H01L 27/14634 |
| 2019/0035736 A1* | 1/2019 | Kuo .................. H01L 21/76229 |
| 2019/0139895 A1* | 5/2019 | Jeng ................. H01L 21/76877 |
| 2020/0161199 A1 | 5/2020 | Tsuyutani |
| 2020/0319135 A1 | 10/2020 | Fan |
| 2021/0202301 A1* | 7/2021 | Wu ................. H01L 21/823481 |

FOREIGN PATENT DOCUMENTS

| | | |
|---|---|---|
| TW | 201611219 A | 3/2016 |
| TW | 202127548 A | 7/2021 |

* cited by examiner

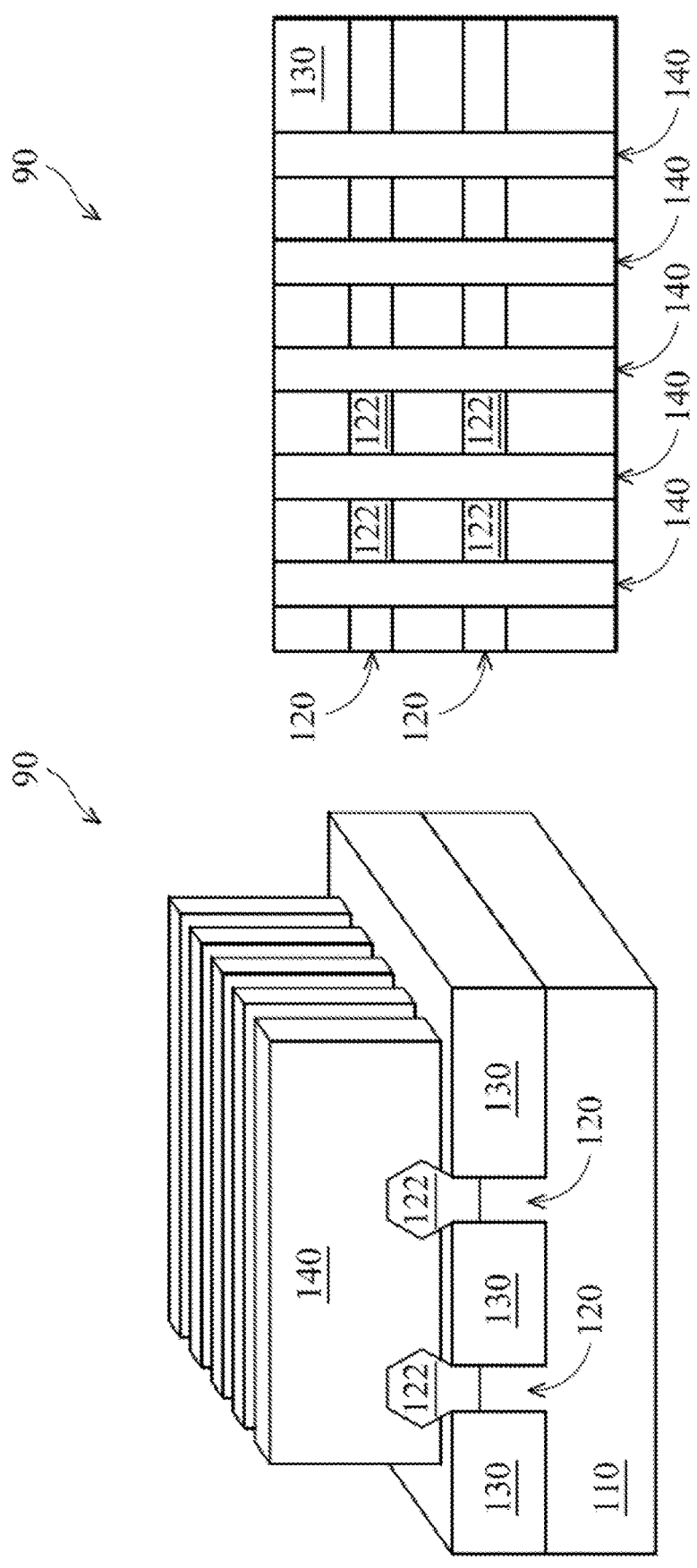
Fig. 1A
Fig. 1B

FORMING TRENCH IN IC CHIP THROUGH MULTIPLE TRENCH FORMATION AND DEPOSITION PROCESSES

PRIORITY DATA

The present application is a utility U.S. Patent Application of provisional U.S. patent application Ser. No. 63/393,556, filed on Jul. 29, 2022, entitled "Forming Trench In IC Chip Through Multiple Trench Formation And Deposition Processes" and U.S. Patent application of Provisional U.S. Ser. No. 63/409,045, filed on Sep. 22, 2022, entitled "Forming Trench In IC Chip Through Multiple Trench Formation And Deposition Processes" the disclosures of each of which are hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, as the scaling down process continues, it has brought about certain fabrication challenges. For example, IC chips that have experienced failures or other performance issues may be tested as a part of debugging process to identify the source of the failures or performance issues. However, as the IC chips are manufactured under ever-smaller technology nodes, the debugging of the IC chips may become increasingly difficult. Often times, the existing circuit components (e.g., existing metallization components) on an IC chip may block signals emitted by the IC chip, which may interfere with the debugging process. As a result, although existing IC chip debugging processes have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 1A illustrates a three-dimensional perspective view of a FinFET device.

FIG. 1B illustrates a top view of a FinFET device.

DETAILED DESCRIPTION

Figure 1C:
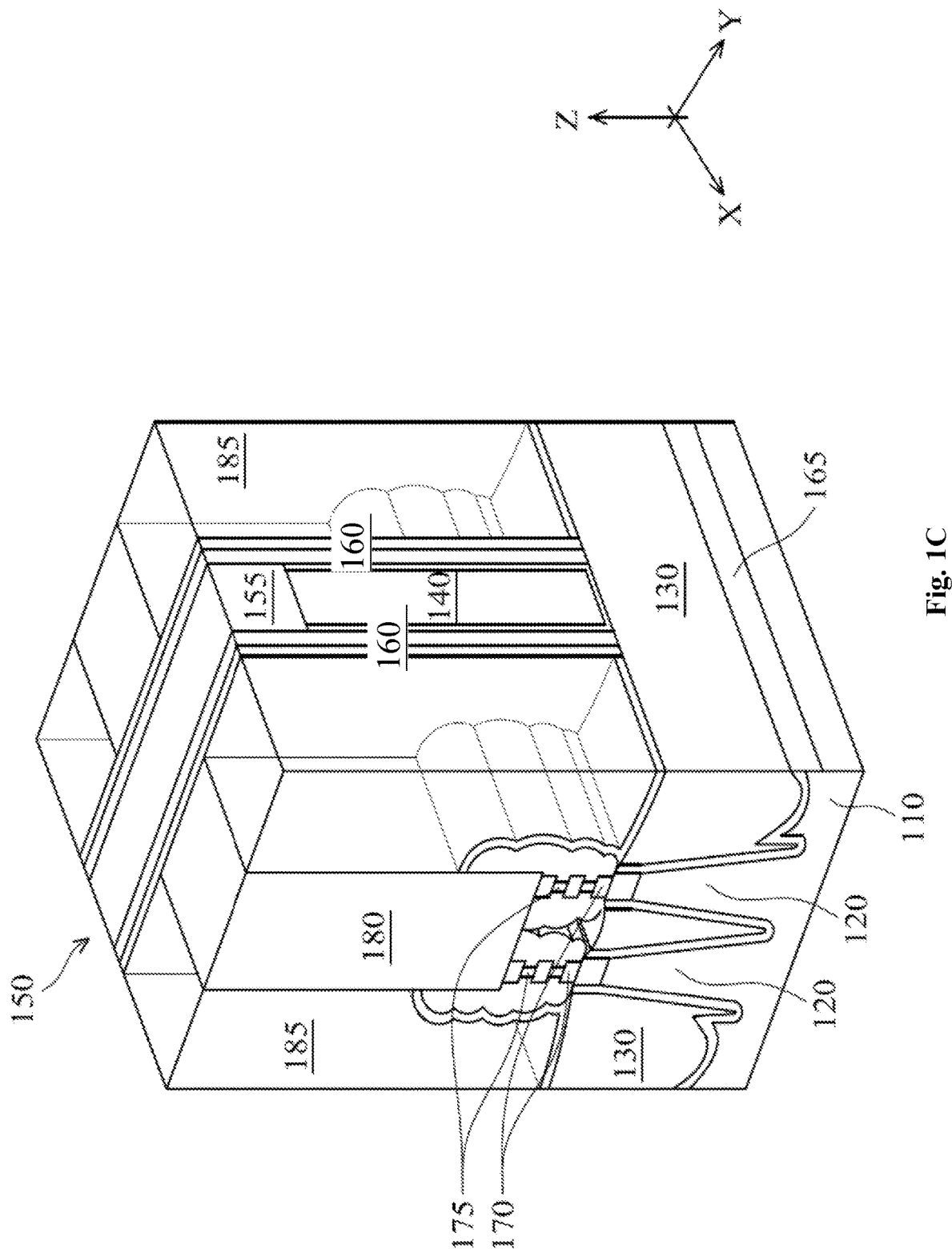
FIG. 1C illustrates a three-dimensional perspective view of a multi-channel gate-all-around (GAA) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to a unique fabrication process flow to package IC chips, such as Super Power Rail (SPR) chips, such that the IC chips may be conveniently debugged without running into interference issues with the existing metallization components on the IC chips. In more detail, conventional IC chips typically include a semiconductor substrate on (or in) which transistors are formed. Metallization components are then formed on one side (typically referred to as a "front side") of the substrate. The metallization components may include the metal lines or conductive vias that are parts of a multi-layer interconnect structure. As an IC chip undergoes a debugging process to identify faults, electrical testing signals may be sent to the IC chip to make the IC chip operate in a given mode. The IC chip may emit signals during its operation, and an emission detecting tool (e.g., an electron beam machine, or e-beam machine) may be placed on the "back side" (e.g., the side opposite the metallization components) of the IC chip to collect the emitted signals. Based on an analysis of the signals emitted from the IC chip under-test, the source (e.g., a location of a failure and/or a reason for the failure) of the faults may be identified.

However, as IC chips progress to more advanced technology nodes, some IC chips (e.g., SPR chips) now have metallization components on both sides of the substrate. In other words, metallization components such as metal lines and vias may exist not only on the front side of the substrate, but on the back side of the substrate as well. As such, regardless of where or how the emission detecting tool is placed in relation to the IC chip that is being debugged, the signals emitted by that IC chip may be blocked or otherwise obstructed by the metallization components either on the front side or the back side, which makes testing difficult and unsatisfactory.

To address the issues discussed above, the present disclosure utilizes a novel packaging and testing process flow to partially remove a printed circuit board (PCB) and some of the metallization components located on the back side of the IC chip. This forms a trench that exposes the target regions of the IC chip and allows the signals from the target regions of the IC chip to emit out of the trench. The emitted signals may then be detected by a detection tool for fault analysis. However, since semiconductor device sizes (including the metallization components) are becoming smaller, the formation of the trench itself may cause damage to the metallization components (e.g., a partial or complete collapse of one or more metal lines) and/or lead to electrical shorting. To avoid the problems caused by the formation of the trench, the present disclosure utilizes a multi-step approach to form the trench. For example, a first trench may be formed to extend partially into the PCB, and a first refill material may be deposited into the first trench. A second trench may then be formed in the first refill material, where the second trench is narrower than the first trench and extends further into the PCB. The second trench is then filled with a second refill material. A third trench may then be formed in the second refill material, where the third trench is narrower than the second trench and extends completely through the PCB. The third trench is then filled with a third refill material. A fourth trench may then be formed in the third refill material, where the fourth trench is narrower than the third trench and extends completely through the PCB and partially into the IC die of the IC chip, for example, by extending through the metallization components formed on the back side of the IC die. The remaining portions of the first, second, and third refill materials may serve as protective components for the rest of the IC chip as the second, third, and fourth trenches are formed, since they protect the metallization components (e.g., metal lines of the PCB) from being damaged or electrically shorted.

Figure 13:
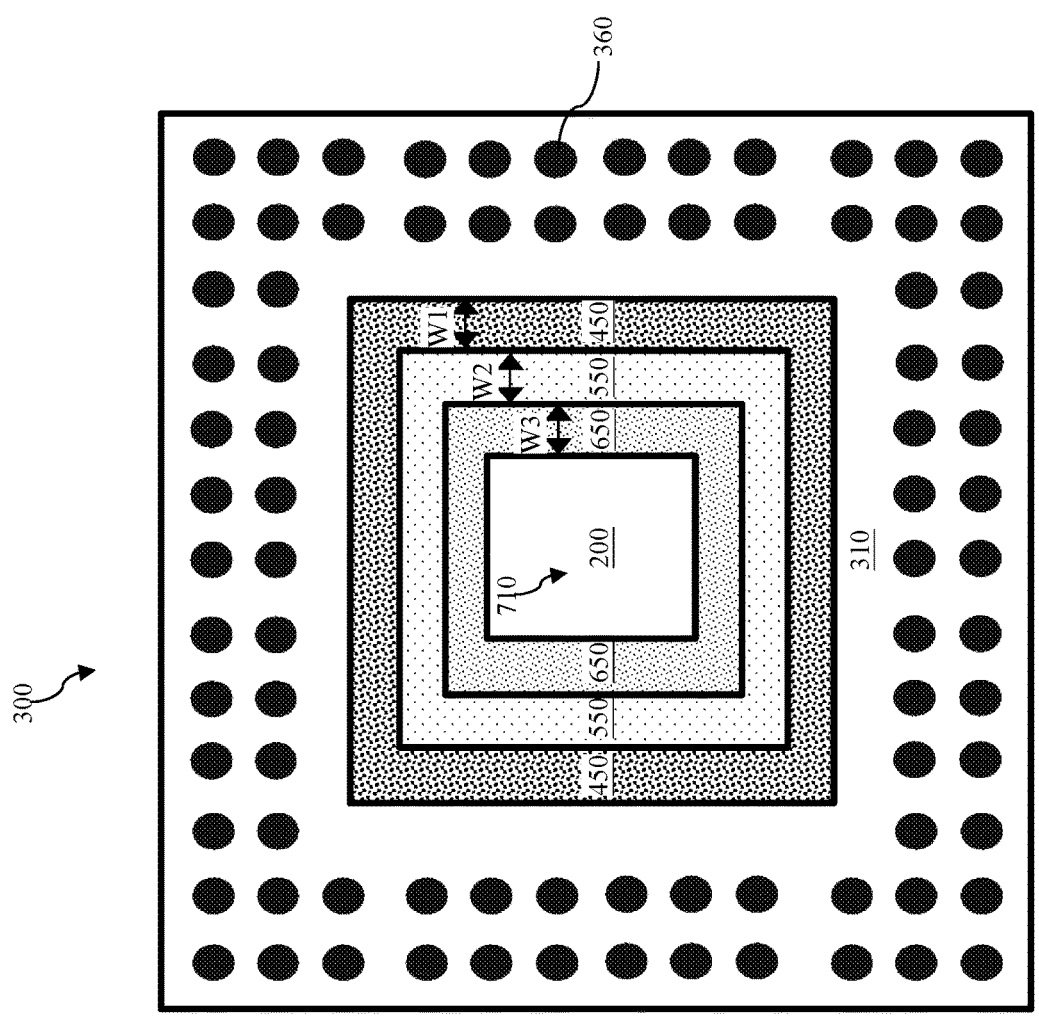
FIG. 13 illustrates a planar top view of the IC chip assembly according to embodiments of the present disclosure.
Figure 14:
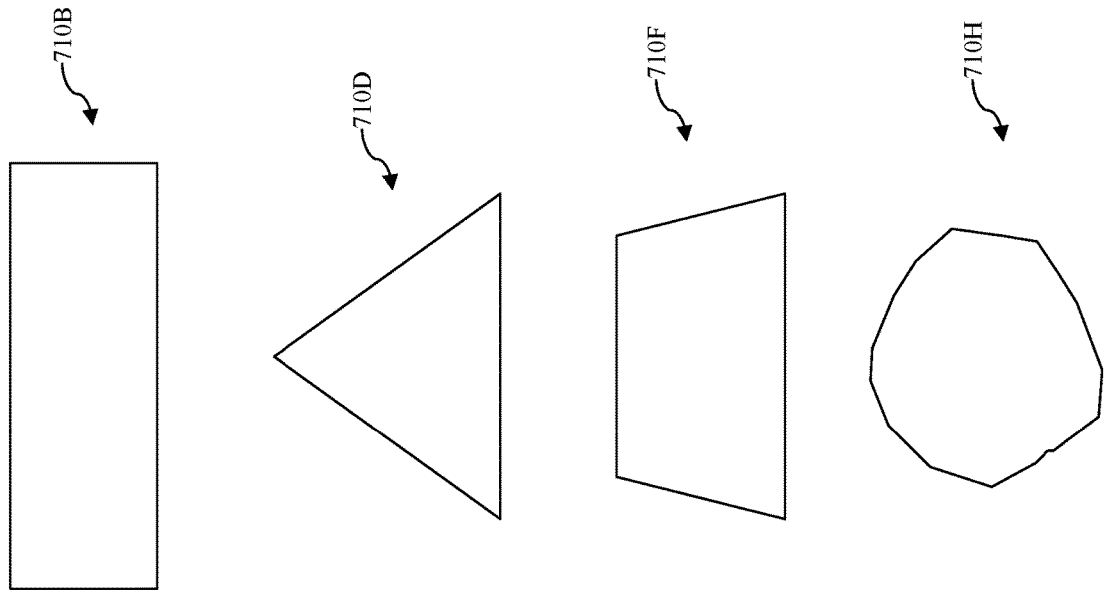
FIG. 14 illustrates planar top view profiles of different embodiments of a trench formed in the IC chip assembly according to embodiments of the present disclosure.
Figure 14:
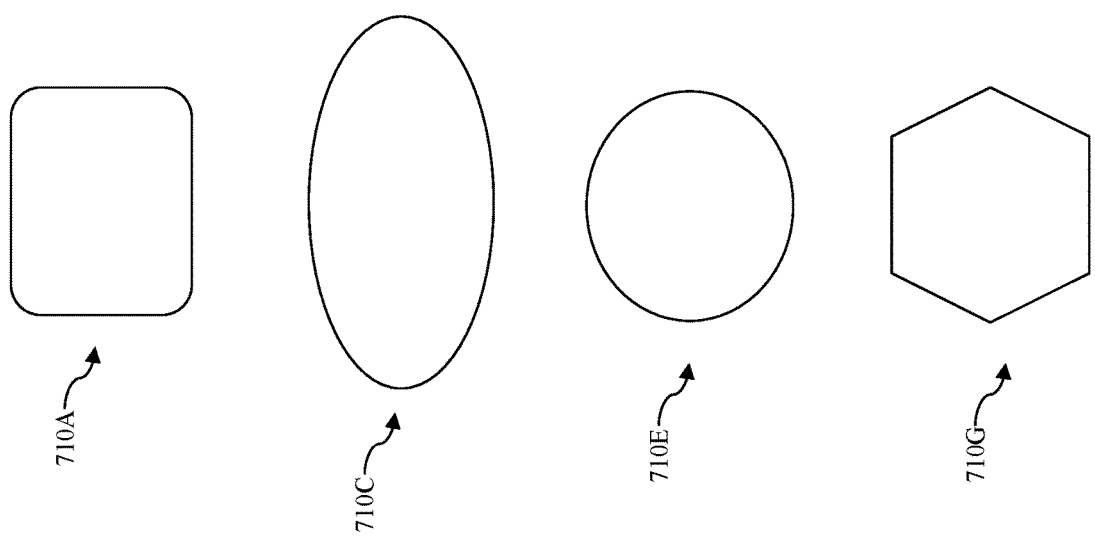
Figure 15:
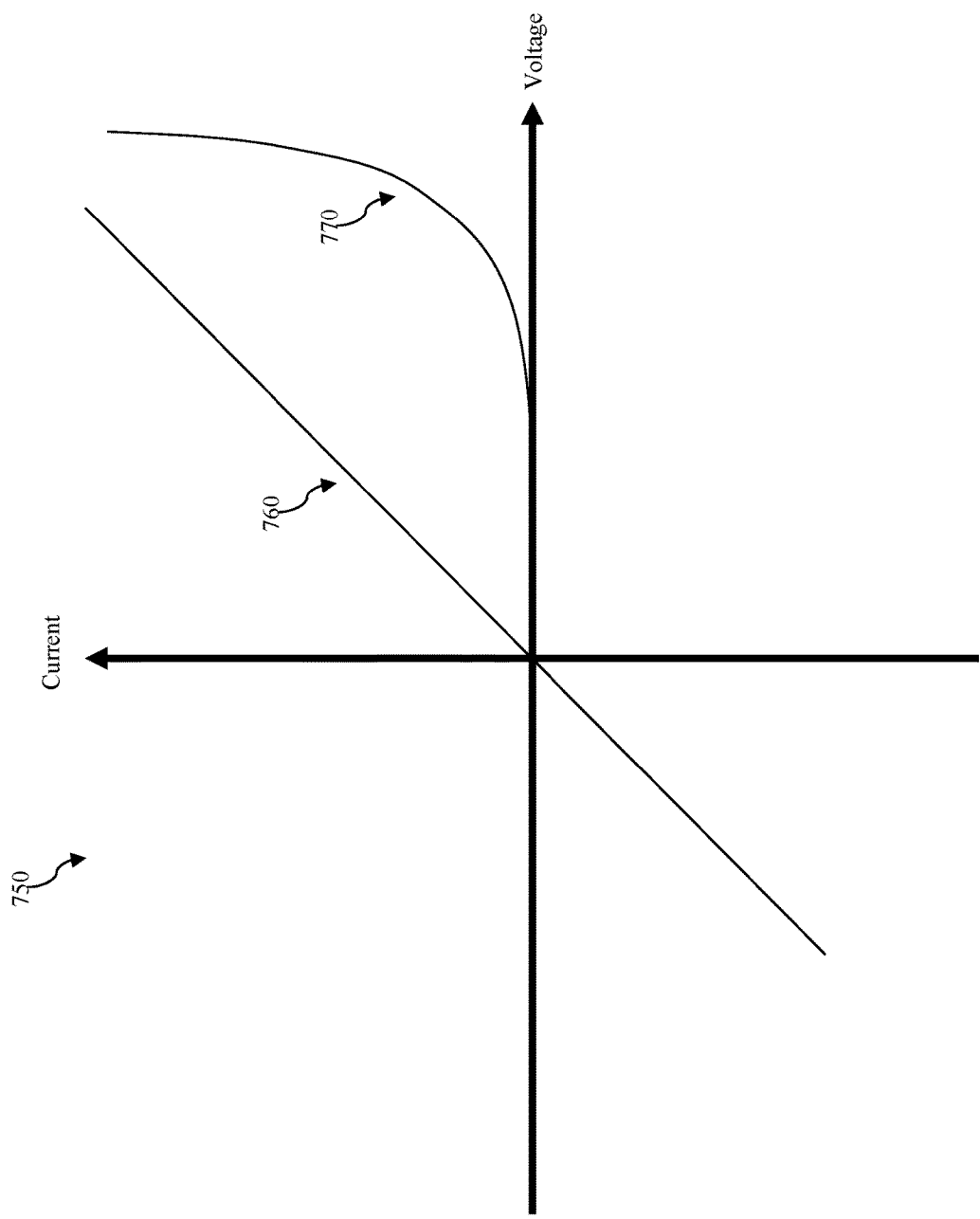
FIG. 15 illustrates a graph of electrical performance according to embodiments of the present disclosure.
Figure 16:
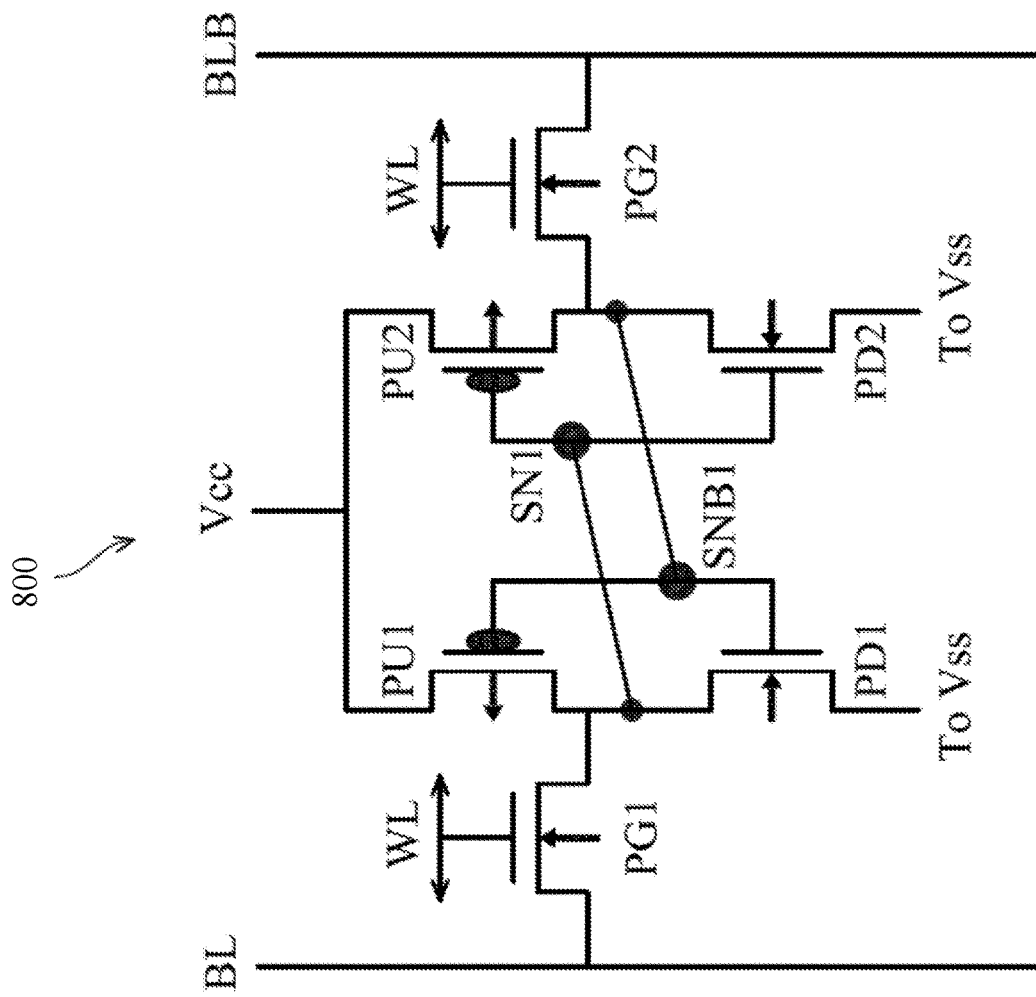
FIG. 16 is a circuit schematic of an SRAM cell according to various aspects of the present disclosure.
Figure 17:
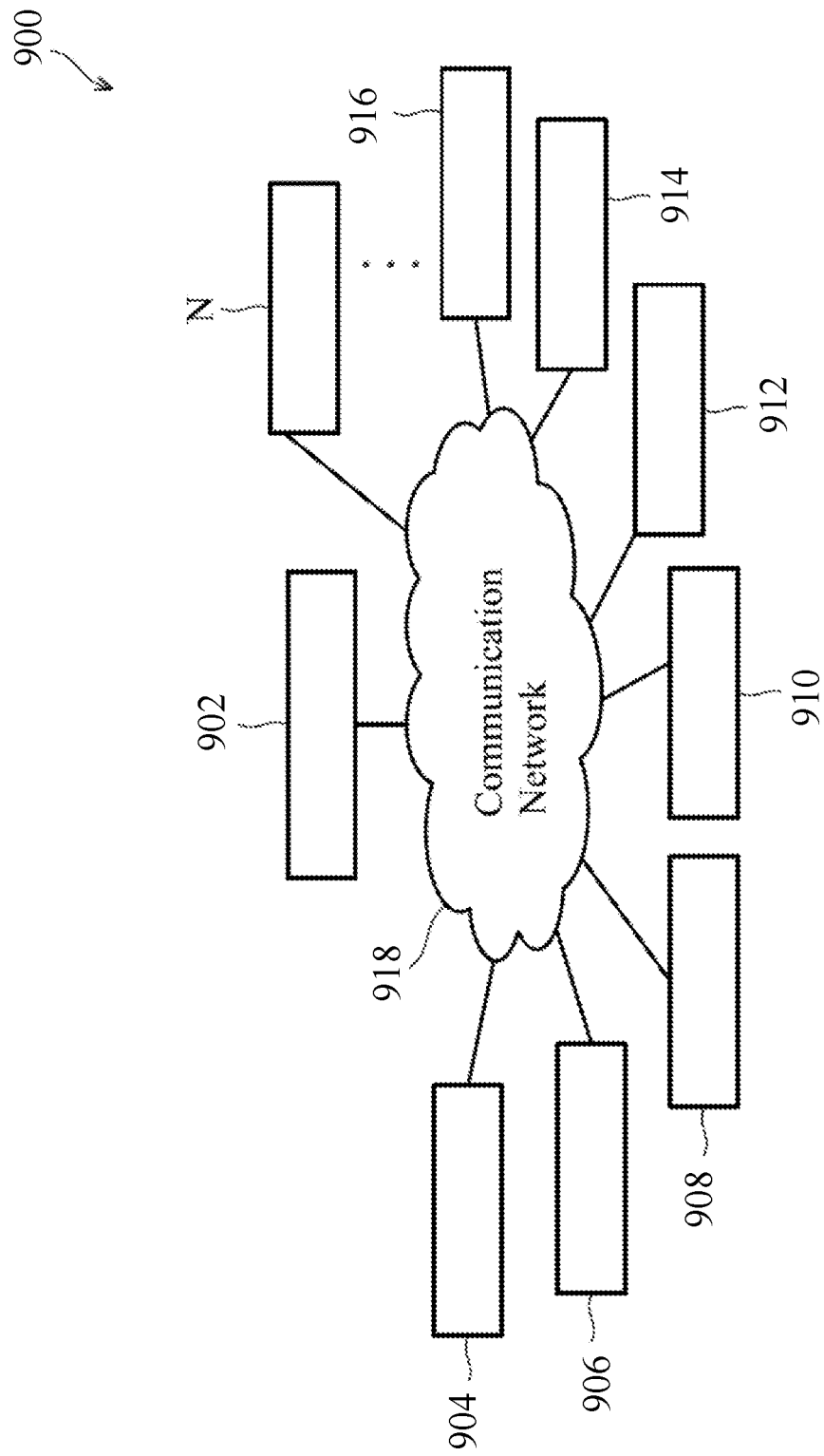
FIG. 17 is a block diagram of a manufacturing system according to various aspects of the present disclosure.
Figure 18:
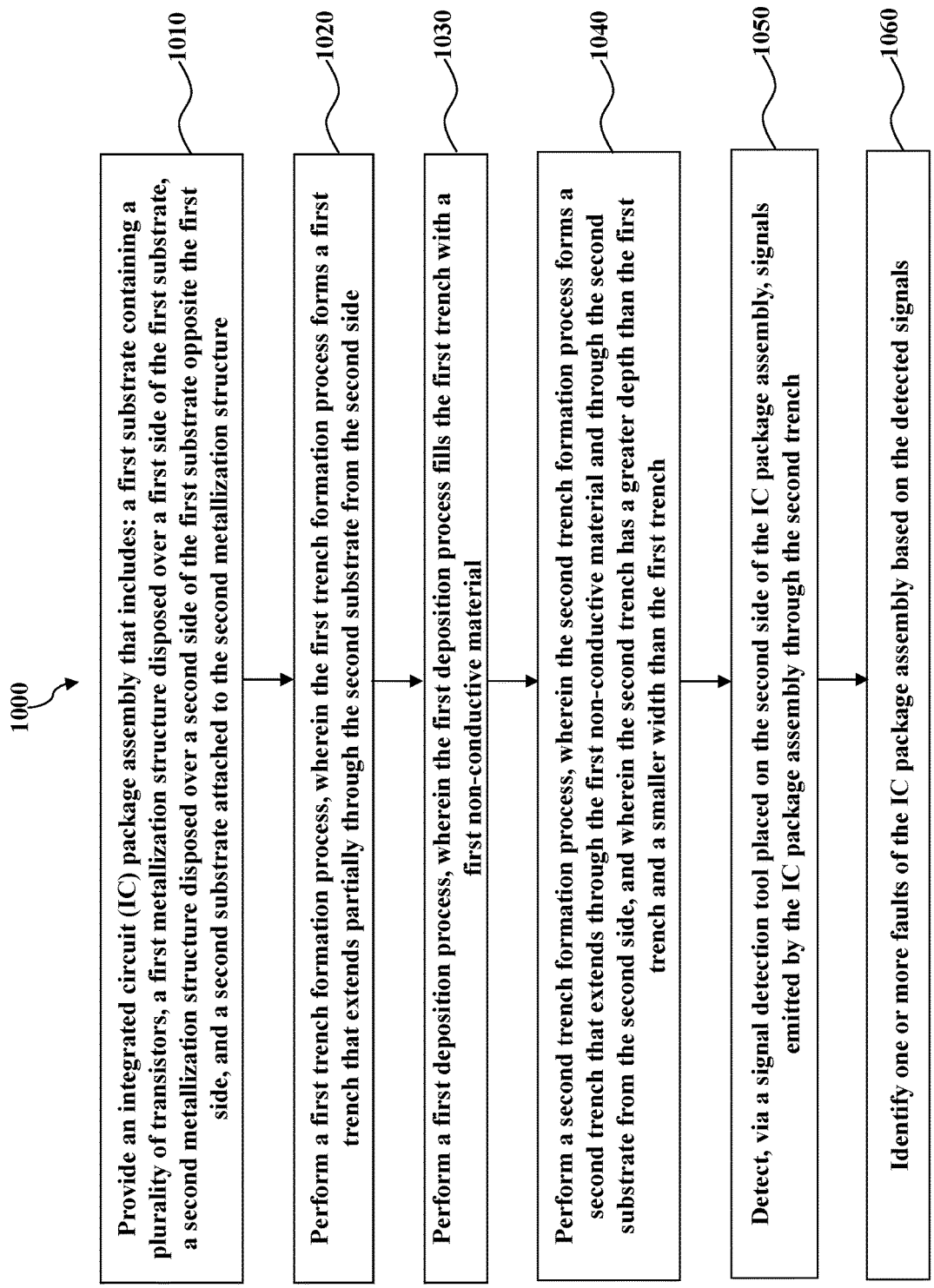
FIG. 18 is a flowchart illustrating a method according to various aspects of the present disclosure.

The various aspects of the present disclosure are now discussed in more detail with reference to FIGS. 1A, 1B, 1C, and 2-18. In more detail, FIGS. 1A-B illustrate an example FinFET device, and FIG. 1C illustrates an example GAA device. FIG. 2-12 illustrate cross-sectional side views of an IC chip assembly at various stages of packaging/testing according to embodiments of the present disclosure. FIG. 13 illustrates a planar top view of the IC chip assembly according to embodiments of the present disclosure. FIG. 14 illustrates various planar top view profiles of different embodiments of a trench that is formed in the IC chip assembly according to embodiments of the present disclosure. FIG. 15 illustrates a graph of electrical performance of two different IC chips. FIG. 16 illustrates a memory device in which the IC die of the present disclosure may be implemented. FIG. 17 illustrates a semiconductor fabrication system that may be used to fabricate the IC device of the present disclosure. FIG. 18 illustrates a method of packaging and testing an IC device according to various aspects of the present disclosure.

Referring now to FIGS. 1A and 1B, a three-dimensional perspective view and a top view of a portion of an Integrated Circuit (IC) device 90 are illustrated, respectively. The IC device 90 is implemented using field-effect transistors (FETs) such as three-dimensional fin-line FETs (FinFETs). FinFET devices have semiconductor fin structures that protrude vertically out of a substrate. The fin structures are active regions, from which source/drain region(s) and/or channel regions are formed. Source/drain region(s) may refer to a source or a drain, individually or collectively dependent upon the context. A source/drain region may also refer to a region that provides a source and/or drain for multiple devices. The gate structures partially wrap around the fin structures. In recent years, FinFET devices have gained popularity due to their enhanced performance compared to conventional planar transistors.

As shown in FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 may include elongated fin-like structures that protrude upwardly out of the substrate 110. As such, the active regions 120 may be interchangeably referred to as fin structures 120 or fins 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain components 122 formed over the fin structures 120. The source/drain components 122 (also referred to source/drain regions) may refer to a source or a drain of a transistor, individually or collectively, dependent upon the context. The source/drain components 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. In other words, the gate structures 140 each wrap around a plurality of fin structures 120. The gate structures 140 may be dummy gate structures (e.g., containing an oxide gate dielectric and a polysilicon gate electrode), or they may be High-k metal gate (HKMG) structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIGS. 1A-1B, multiple fin structures 120 are each oriented lengthwise along the X-direction, and multiple gate structures 140 are each oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

FIG. 1C illustrates a three-dimensional perspective view of an example multi-channel gate-all-around (GAA) device 150. GAA devices have multiple elongated nano-structure channels that may be implemented as nano-tubes, nano-sheets, or nano-wires. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A layer 155 is located over the gate structure 140, and gate spacer structures 160 are located on sidewalls of the gate structure 140. A capping layer 165 is formed over the fin structures 120 to protect the fin structures 120 from oxidation during the forming of the isolation structures 130.

A plurality of nano-structures 170 is disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each stack of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180. The ILD 185 may be referred to as an ILD0 layer. In some embodiments, the ILD 185 may include silicon oxide, silicon nitride, or a low-k dielectric material.

The FinFET devices of FIGS. 1A-1B and the GAA devices of FIG. 1C may be utilized to implement electrical circuitries having various functionalities, such as memory devices (e.g., static random access memory (SRAM) devices), logic circuitries, input/output (I/O) devices, application specific integrated circuit (ASIC) devices, radio frequency (RF) circuitries, drivers, micro-controllers, central processing units (CPUs), image sensors, etc., as non-limiting examples.

Figure 2:
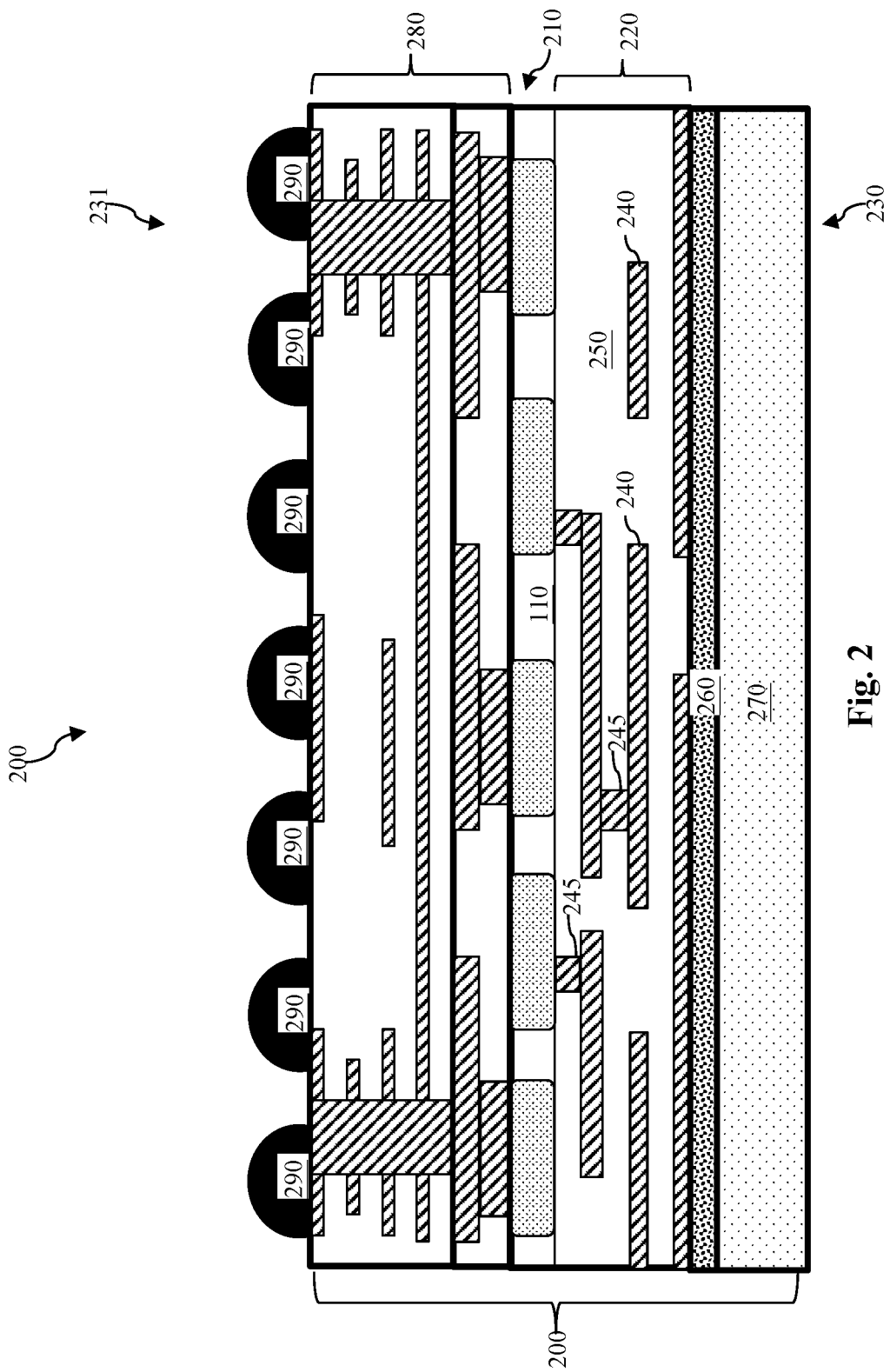
FIGS. 2-12 illustrate a series of cross-sectional side views of an IC chip assembly at various stages of packaging and testing according to embodiments of the present disclosure.

FIG. 2 illustrates a diagrammatic fragmentary cross-sectional side view of an IC die 200 that contains the FinFET or GAA transistors of FIGS. 1A-1C discussed above according to various embodiments of the present disclosure. The IC die 200 has metallization components on both its front side and its back side. As discussed above, such an arrangement of the metallization components could cause the signals emitted by the IC die 200 (and meant to be detected by a detection tool) to be blocked by the metallization components, which could interfere with a debugging process. To address this issue, the present disclosure involves a novel packaging process flow, so that the signals emitted by the IC chip can be detected by the detection tool without obstruction, as will be discussed in more detail below with reference to FIGS. 3-18.

Still referring to FIG. 2, the IC die 200 in the illustrated embodiment is a Super Power Rail (SPR) die. In that regard, in conventional chip structures, source/drain contacts and gate contacts of transistors on a substrate connect source/drain features of the transistors to an interconnect structure over a front side of the substrate. As the dimensions of IC devices shrink, the close proximity among the source contacts and gate contacts may reduce process windows for forming these contacts and may increase parasitic capacitance among them. To alleviate these concerns, SPR chips may implement a backside source/drain contact through the substrate of the SPR chip to come in contact with a source/drain feature, and a power rail is formed on the backside of the substrate to be in contact with the backside source/drain contact. Since the implementation of SPR structures eases the crowding of contacts, SPR chips entail a modern solution for performance boost on power delivery network (PDN) for advanced technology nodes.

Additional details of the IC die 200 are now discussed below. The IC die 200 includes a plurality of transistors 210. The transistors 210 may be formed in or on the substrate 110 discussed above, which may comprise an elementary (single element) semiconductor, a compound semiconductor, an alloy semiconductor, and/or other suitable materials. The transistors 210 may include the FinFET transistors shown in FIGS. 1B-1C and/or the GAA transistors shown in FIG. 1C. The transistors 210 may include active regions, such the fin structures 120 or the stacks of nano-structures 170 discussed above in association with FIGS. 1A-1C. The transistors 210 also include High-k metal gate (HKMG) structures 140 discussed above, which may partially wrap around the active regions (e.g., wrapping around a fin structure). As discussed above, the HKMG structures may be formed by replacing dummy gate structures, and they may each include a high-k gate dielectric and a metal-containing gate electrode. Example materials of the high-k gate dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The metal-containing gate electrode may include one or more work function metal layers and one or more fill metal layers. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), titanium aluminum nitride (TiAlN), zirconium aluminide (ZrAl), tungsten aluminide (WAl), tantalum aluminide (TaAl), hafnium aluminide (HfAl), or combinations thereof. The fill metal layer may serve as a main conductive portion of the gate electrode layer. For reasons of simplicity, the details of the transistors 210 are not illustrated in FIG. 2 or the subsequent figures.

The substrate 110 has two opposite sides, for example, a side 230 and a side 231. The side 230 may also be interchangeably referred to hereinafter as a front side 230 of the IC die 200, and the side 231 may also be interchangeably referred to hereinafter as a back side 231 of the IC die 200. A multi-layer interconnect structure 220 is formed on the side 230 of the substrate 110. The interconnect structure 220 includes a plurality of patterned dielectric layers and interconnected conductive layers. These interconnected conductive layers provide interconnections (e.g., wiring) between circuitries, inputs/outputs, and various doped features formed in the substrate 110. For example, the interconnect structure 220 may include a plurality of interconnect layers, also referred to as metal layers (e.g., M1, M2, M3, etc.). Each of the interconnect layers includes a plurality metal lines, such as metal lines 240. The interconnect structure 220 may also include a plurality of conductive vias, such as conductive vias 245, that electrically couple the various metal lines 240 together. The metal lines 240 and the conductive vias 245 may contain conductive materials, such as aluminum, copper, aluminum alloy, copper alloy, aluminum/silicon/copper alloy, titanium, titanium nitride, tantalum, tantalum nitride, tungsten, cobalt, ruthenium, metal silicide, or combinations thereof. The interconnect structure 220 also includes an interlayer dielectric (ILD) 250 that provides electrical and physical isolation between the interconnect layers. The ILD 250 may include a dielectric material such as an oxide material or a low-k dielectric. It may be said that the metal lines 240 and the conductive vias 245 are embedded in the ILD 250.

A bonding layer 260 is disposed over the interconnect structure 220. In some embodiments, the bonding layer 260 includes an oxide material. The bonding layer 260 bonds a carrier substrate 270 to a rest of the IC die 200. For example, the interconnect structure 220 is bonded to the carrier substrate 270 through the bonding layer 260. In some embodiments, the carrier substrate 270 includes bulk silicon. In other embodiments, the carrier substrate 270 includes another suitable material that provides sufficient rigidity and/or mechanical support for the rest of the IC die 200.

While the interconnect structure 220, the bonding layer 260, and the carrier substrate 270 are located on the side 230 (e.g., the front side) of the substrate 110, a power delivery network (PDN) 280 is formed on the side 231 (e.g., the back side) of the substrate 110. The PDN 280 is a structure that delivers power and ground voltages from conductive pad locations to the various components (e.g., the transistors 210) of the IC die 200. In some embodiments, the PDN 280 includes a plurality of layers, where each layer includes one or more power rails and/or ground rails. The power rails or ground rails may be in the form of metal lines. The various layers of the PDN 280 may be electrically interconnected together by conductive vias. Electrical connectivity to the PDN 280 (and to the rest of the IC die 200) may be gained by conductive bumps 290 (e.g., solder balls) that are located on the side 231 of the PDN 280.

Since the PDN 280 includes metal lines and vias, as does the interconnect structure 220, it may be said that the IC die 200 has metallization components formed on both its front side 230 and its back side 231. In conventional IC chips where no PDN is implemented on its back side (i.e., similar to back side 231 herein), signals emitted by the IC die 200 when the IC die 200 is being debugged may be detected by a detection tool placed on the back side of the IC die 200 without obstruction or interference from metallization components. However, for the IC die 200 illustrated herein, the metal lines and/or vias of the PDN 280 may at least partially block the transmission of the signals emitted by the IC die 200. To address this issue, the present disclosure involves a packaging and testing process where a trench or an opening is formed on the back side 231 through the PDN 280. Such a trench allows the signals emitted by the IC die 200 to reach the detection tool placed on the back side 231 without being obstructed, as discussed in greater detail below.

Figure 3:
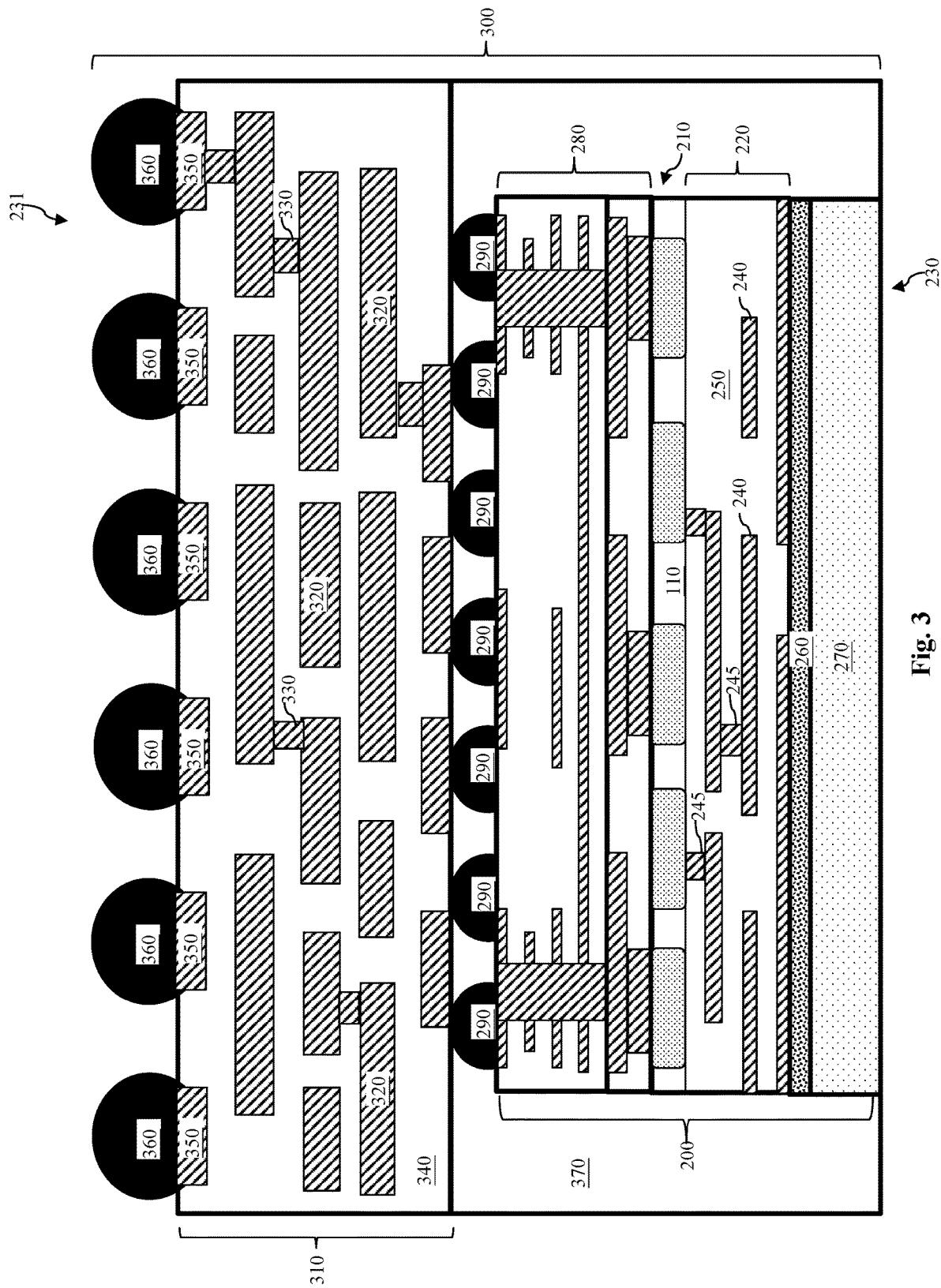

Referring now to FIG. 3, the IC die 200 may be implemented as a part of an IC package assembly 300. The IC package assembly 300 further includes a substrate 310 that is attached to the IC die 200. In some embodiments, the substrate 310 include a printed circuit board (PCB), which may include a plurality of layers that are each configured for routing electrical signals. For example, the PCB may include a plurality of metal lines, such as metal lines 320, in each of the layers. The PCB may also include a plurality of vias 330 that interconnect the metal lines 320 from different layers. The metal lines 320 and the vias 330 are isolated from one another by a dielectric material 340. The PCB (as an example embodiment of the substrate 310) may further include a plurality of conductive pads 350, which may be bonded to a plurality of conductive bumps 360 that are located on the back side 231 of the substrate 310, respectively. In some embodiments, the conductive pads 350 may be metal lines of the metal layer that is located closest to the back side 231.

The IC die 200 is bonded to the substrate 310 through the back side 231 of the IC die 200. For example, the conductive bumps 290 are bonded between the IC die 200 and the substrate 310, while a molding material 370 surrounds the IC die 200. The conductive bumps 290 allow electrical signals to be transmitted between the IC die 200 and the substrate 310, while the molding material 370 provides electrical isolation and physical protection for the conductive bumps 290 and other components on the surfaces of the IC die 200 and the substrate 310. As such, the various layers of the substrate 310 may be utilized to perform additional electrical routing for the IC die 200. In some embodiments, the substrate 310 has no active electrical circuitry that contains transistors. In some other embodiments, the substrate 310 may include additional electrical circuitry, which may provide the same functionalities as the electrical circuitry on the IC die 200 or may provide different functionalities from the electrical circuitry on the IC die 200.

In some embodiments, the IC package assembly 300 may be an IC package assembly that is ready for sale to customers. In other words, a customer may purchase the IC package assembly 300 from its manufacturer and implement the IC package assembly 300 on modern day electronic devices, such as desktop or laptop computers, mobile telephones, televisions, radios, automobiles, satellite positioning devices, household appliances, etc. However, from time to time, copies of the IC package assembly 300 may experience failure or run into various bugs, either during actual use or during testing before or after it is shipped to a customer. Such a failed or buggy copy of the IC package assembly 300 may then be tested as a part of a debugging process to identify the reason and/or source of the failure. In such a debugging process, it may be desirable to detect signals emitted from the IC die 200 from the back side 231. In order to make ensure that the metallization features of the PDN 280 do not obstruct or interfere with the emission of the signals from the IC die 200, a trench or an opening will be formed from the back side 231, where the opening extends through the substrate 310 and through the PDN 280 to expose a target region of the transistors 210. The signals emitted from the target region of the transistors 210 may then propagate through the trench and be detected by the detection tool placed on the back side 231 without obstruction from the PDN 280, as discussed in more detail below.

Figure 4:
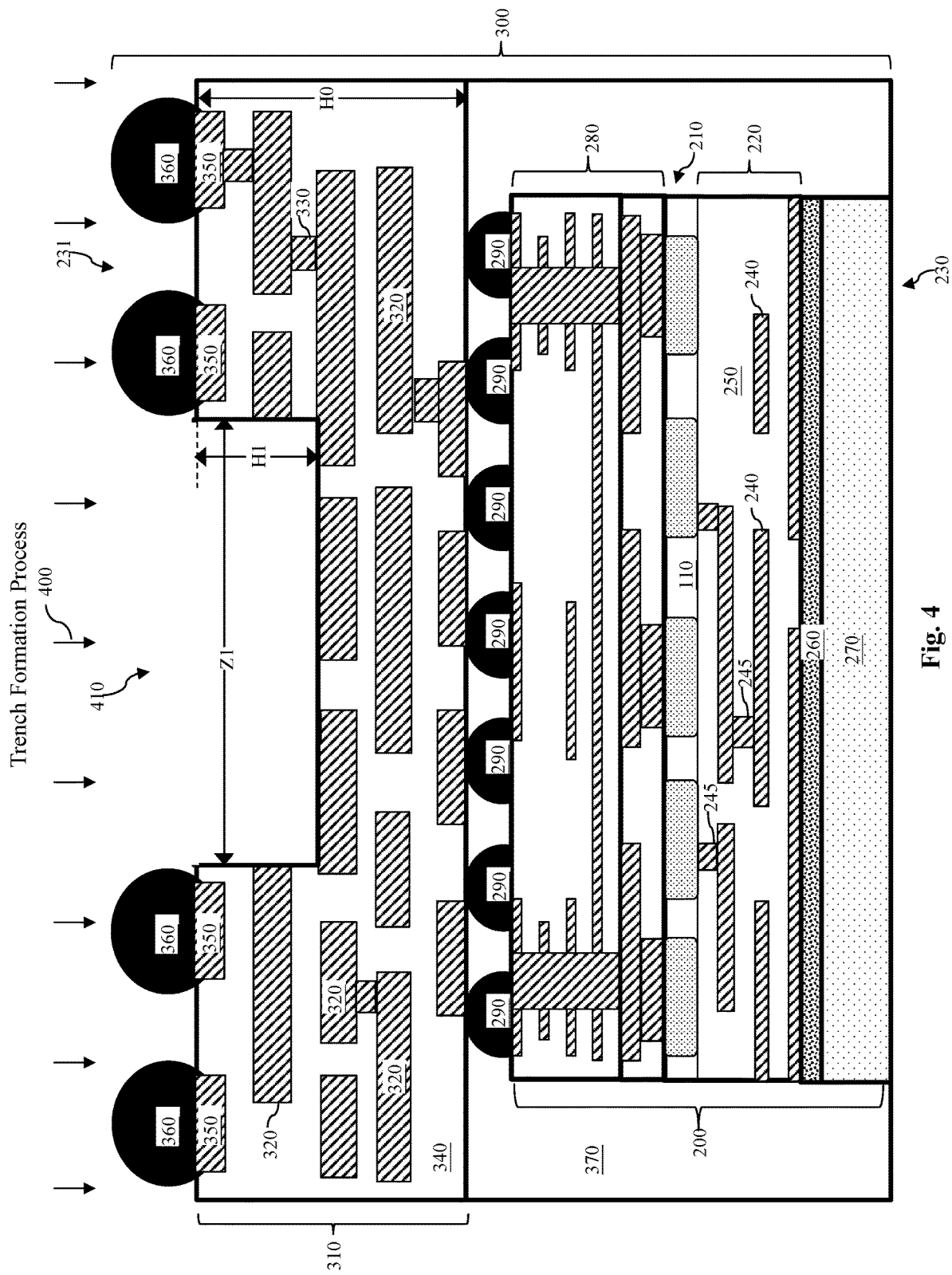

Referring now to FIG. 4, a trench formation process 400 is performed to the IC package assembly 300 to form a trench 410 in the IC package assembly 300. In some embodiments, the trench formation process 400 is performed using a mechanical drill bit. The trench 410 extends from the back side 231 toward the front side 230 of the IC package assembly 300, and it extends partially through the substrate 310. In other words, a height H0 of the substrate 310 (also referred to as a thickness H0 of the substrate 310) is greater than a height H1 of the trench 410. The trench 410 also has a width Z1 as its lateral dimension. At this stage, the trench 410 is relatively wide and shallow. As such, the trench 410 may be formed without substantially damaging the substrate 310, for example, without causing damage to the metal lines 320 and/or the vias 330 located at the sidewalls of the trench 410, and without electrically shorting these metal lines 320 and/or the vias 330.

Figure 5:
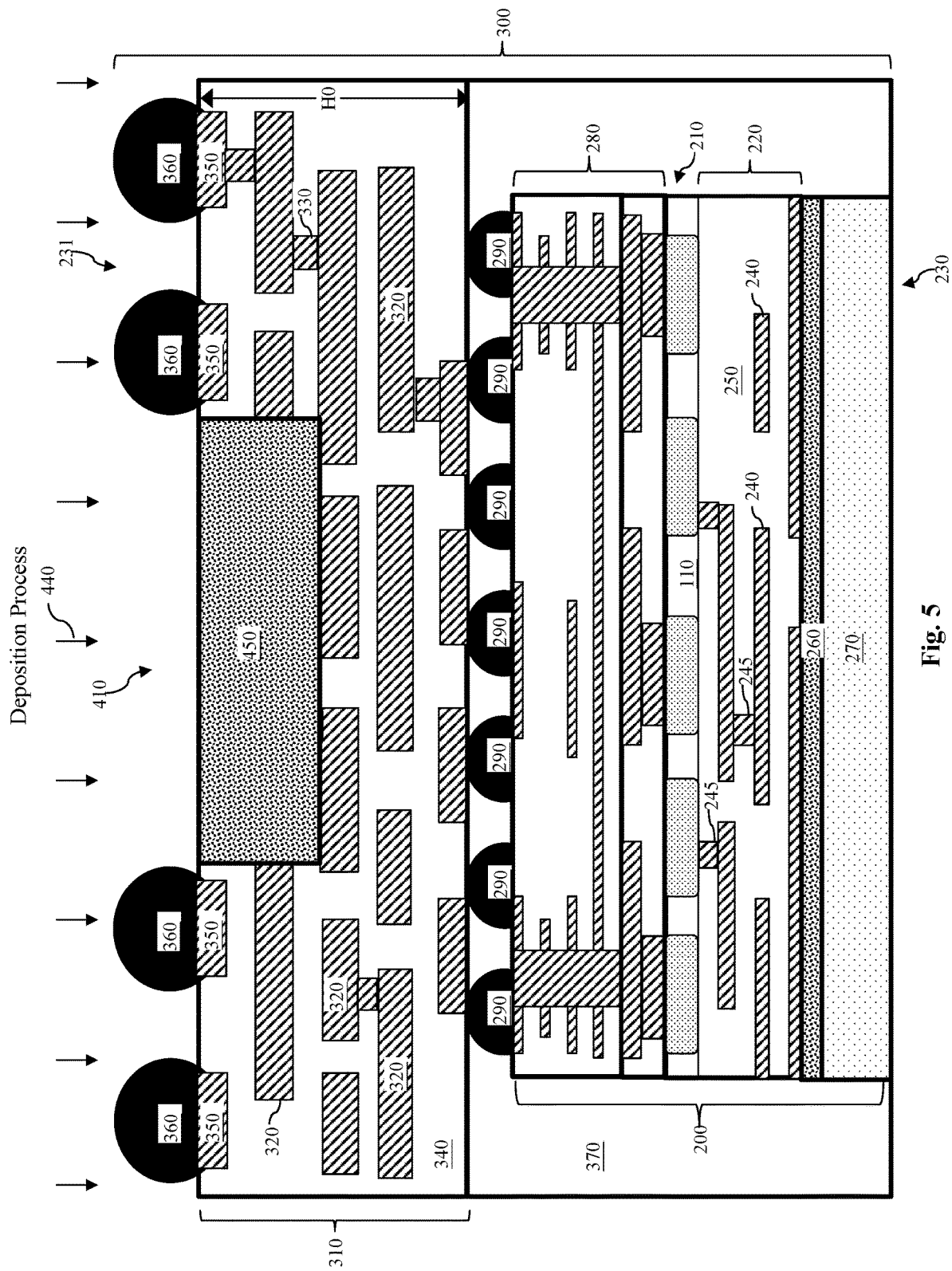

Referring now to FIG. 5, a deposition process 440 is performed to the IC package assembly 300 to fill the trench 410 with a refill material 450. In some embodiments, the refill material 450 includes a non-conductive glue material. In some other embodiments, the refill material 450 includes a dielectric material. In yet other embodiments, the refill material 450 includes an organic material. The refill material 450 will help to protect portions of the substrate 310 from damage caused by additional trench formation processes discussed below.

Figure 6:
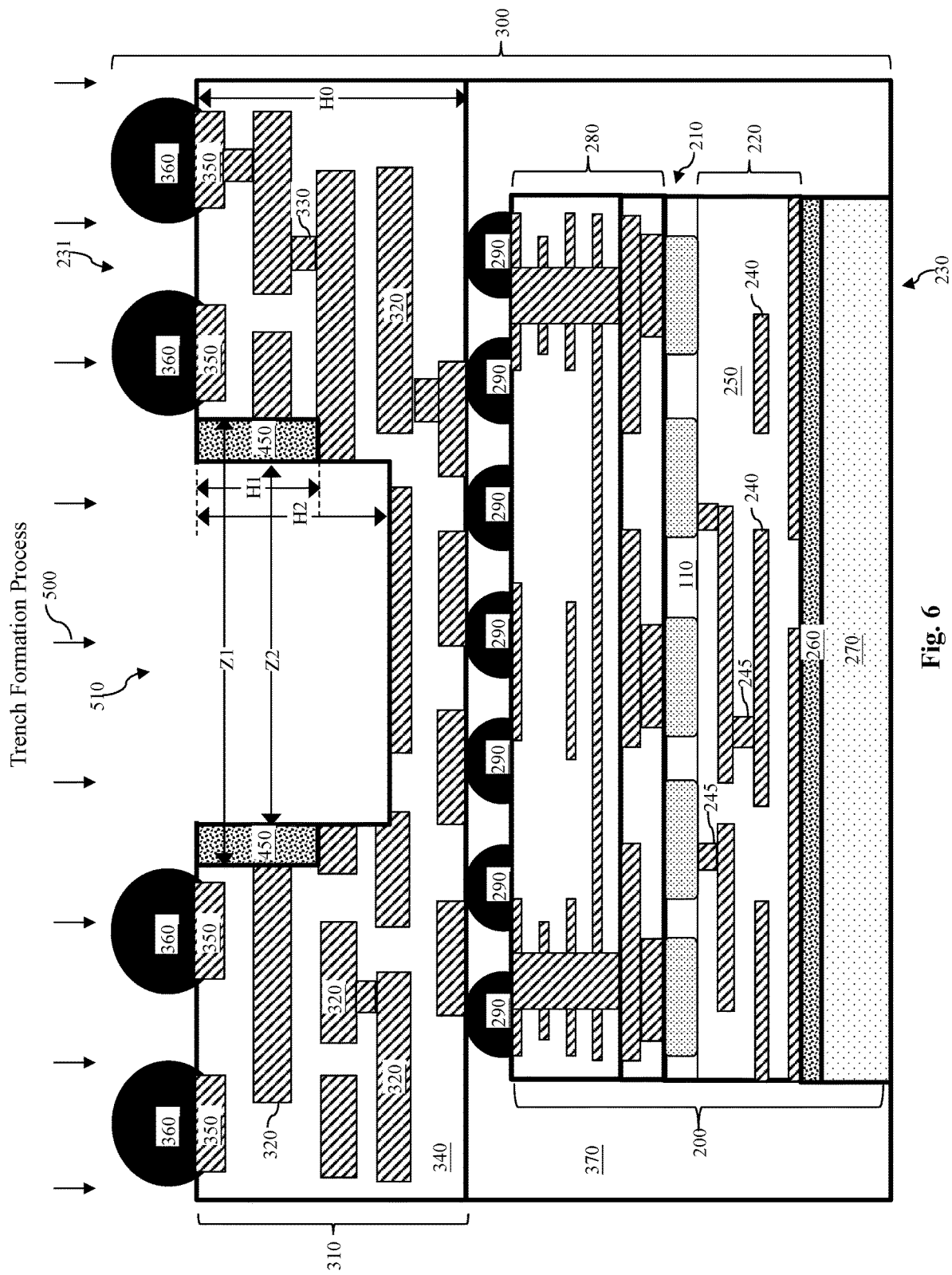

Referring now to FIG. 6, a trench formation process 500 is performed to the IC package assembly 300 to form a trench 510 in the IC package assembly 300. In some embodiments, the trench formation process 500 is also performed using a mechanical drill bit. Similar to the trench 410, the trench 510 also extends partially through the substrate 310 from the back side 231 toward the front side 230 of the IC package assembly 300. However, the trench 510 is narrower and deeper than the trench 410 (see FIG. 4). For example, a height H2 of the trench 510 is greater than the height H1 of the trench 410, and the width Z2 of the trench 510 is smaller than the width Z1 of the trench 410. Portions of the refill material 450 remain after the formation of the trench 510, and they partially define the sidewalls of the trench 510. During the trench formation process 500, the remaining portions of the refill material 450 help protect the internal components (e.g., the metal lines 320 and/or the vias 330) of the substrate 310 from potential damage or electrical shorting.

Figure 7:
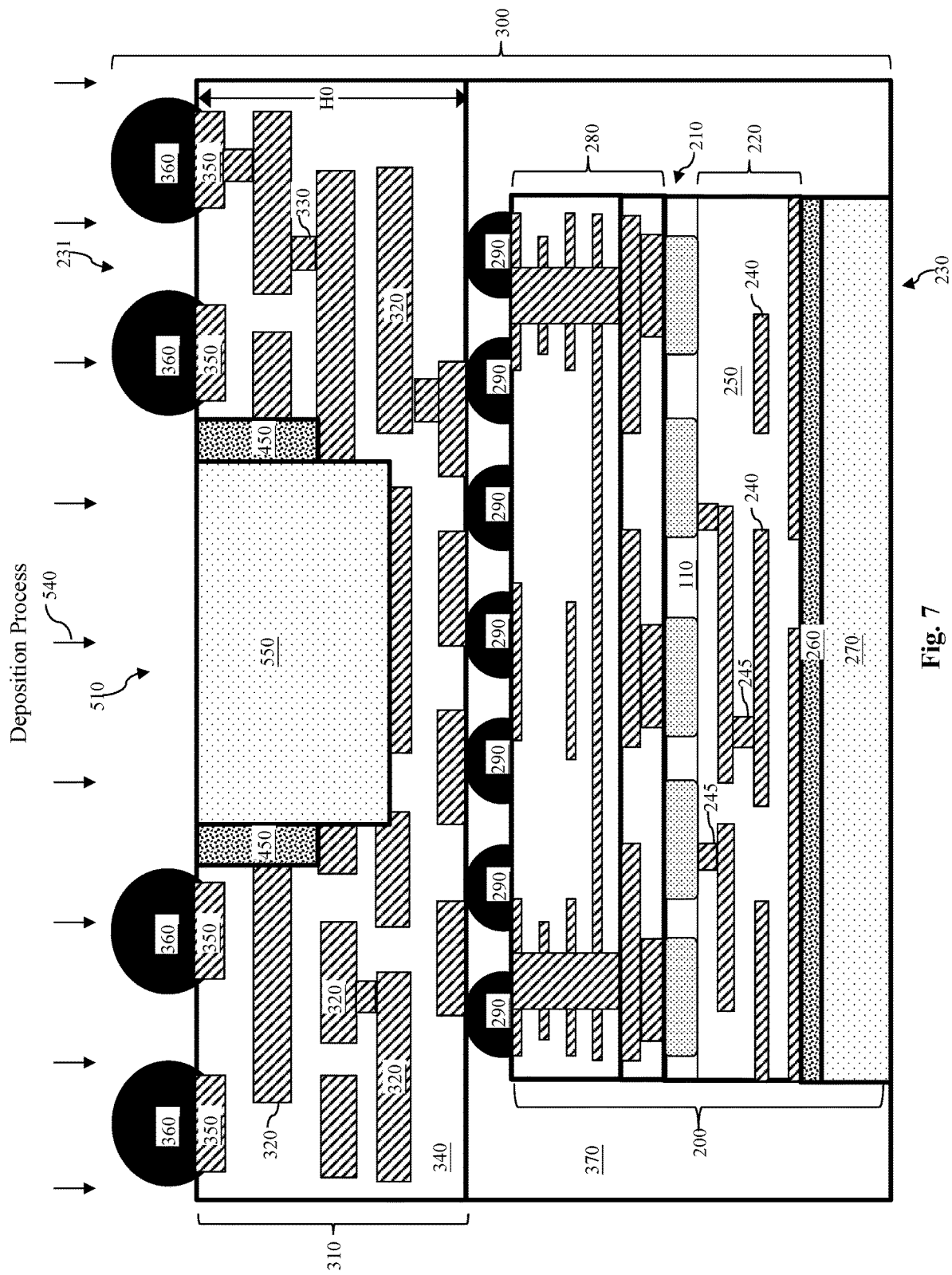

Referring now to FIG. 7, a deposition process 540 is performed to the IC package assembly 300 to fill the trench 510 with a refill material 550. In some embodiments, the refill material 550 includes a non-conductive glue material. In some other embodiments, the refill material 550 includes a dielectric material. In yet other embodiments, the refill material 550 includes an organic material. In some embodiments, the refill material 550 has a same material composition as the refill material 450. In other embodiments, the refill material 550 and the refill material 450 have different material compositions. For example, the refill material 550 may be harder than the refill material 450 in some embodiments, or the refill material 550 may have better adhesion than the refill material 450 in other embodiments. The refill material 550 will help to protect portions of the substrate 310 from damage caused by additional trench formation processes discussed below.

Figure 8:
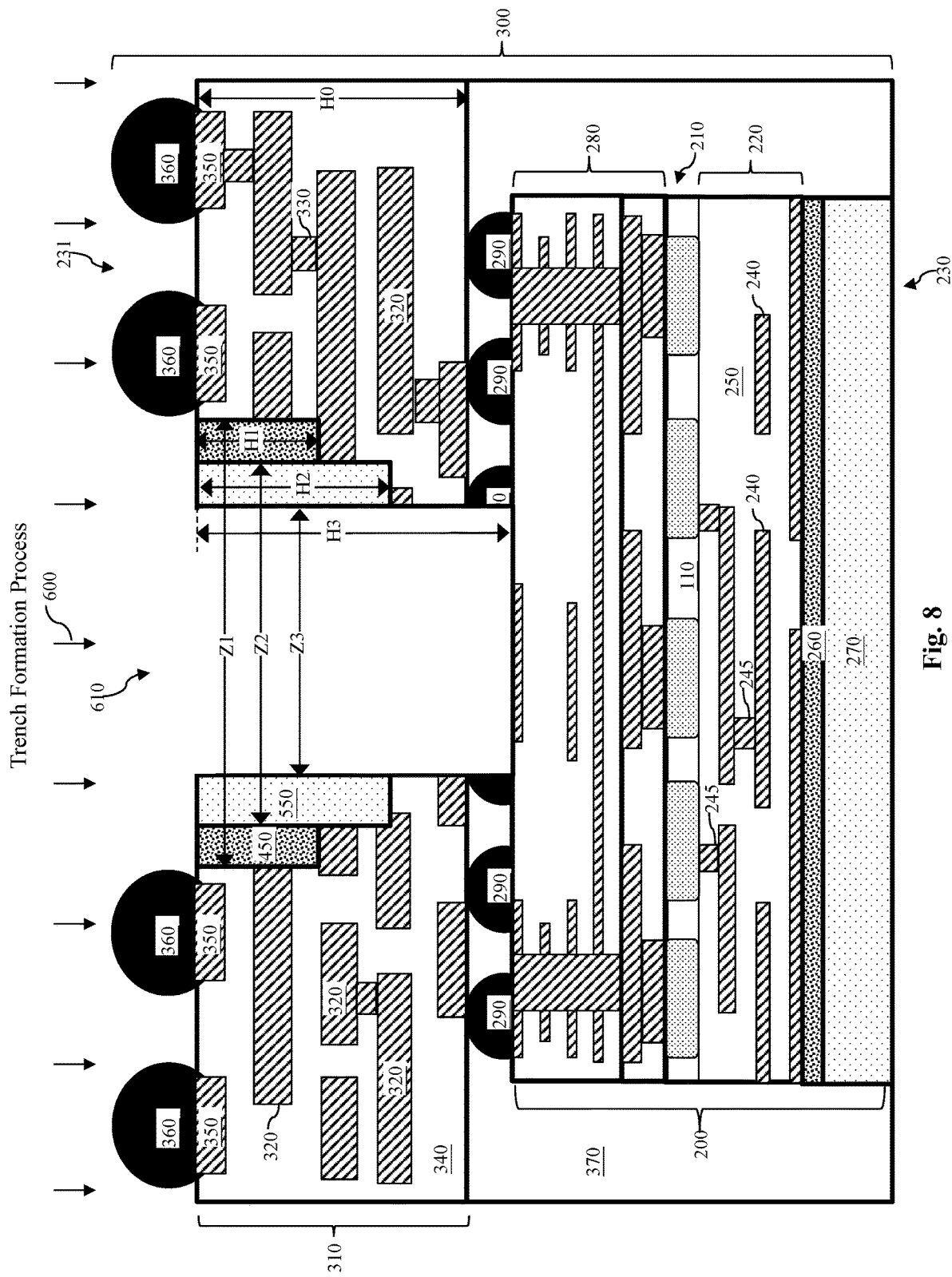

Referring now to FIG. 8, a trench formation process 600 is performed to the IC package assembly 300 to form a trench 610 in the IC package assembly 300. In some embodiments, the trench formation process 600 is also performed using a mechanical drill bit. The trench 610 extends vertically through the substrate 310 from the back side 231 toward the front side 230 of the IC package assembly 300, and it exposes a target portion of the IC die 200. For example, a target region of the PDN 280 of the IC die 200 is exposed by the trench 610. The trench 610 is narrower and deeper than the trench 510 (see FIG. 6). For example, a height H3 of the trench 610 is greater than the height H2 of the trench 510, and the width Z3 of the trench 610 is smaller than the width Z2 of the trench 510. Portions of the refill material 550 remain after the formation of the trench 610, and they partially define the sidewalls of the trench 610. During the trench formation process 600, the remaining portions of the refill material 550 help protect the internal components (e.g., the metal lines 320 and/or the vias 330) of the substrate 310 from potential damage or electrical shorting.

Figure 9:
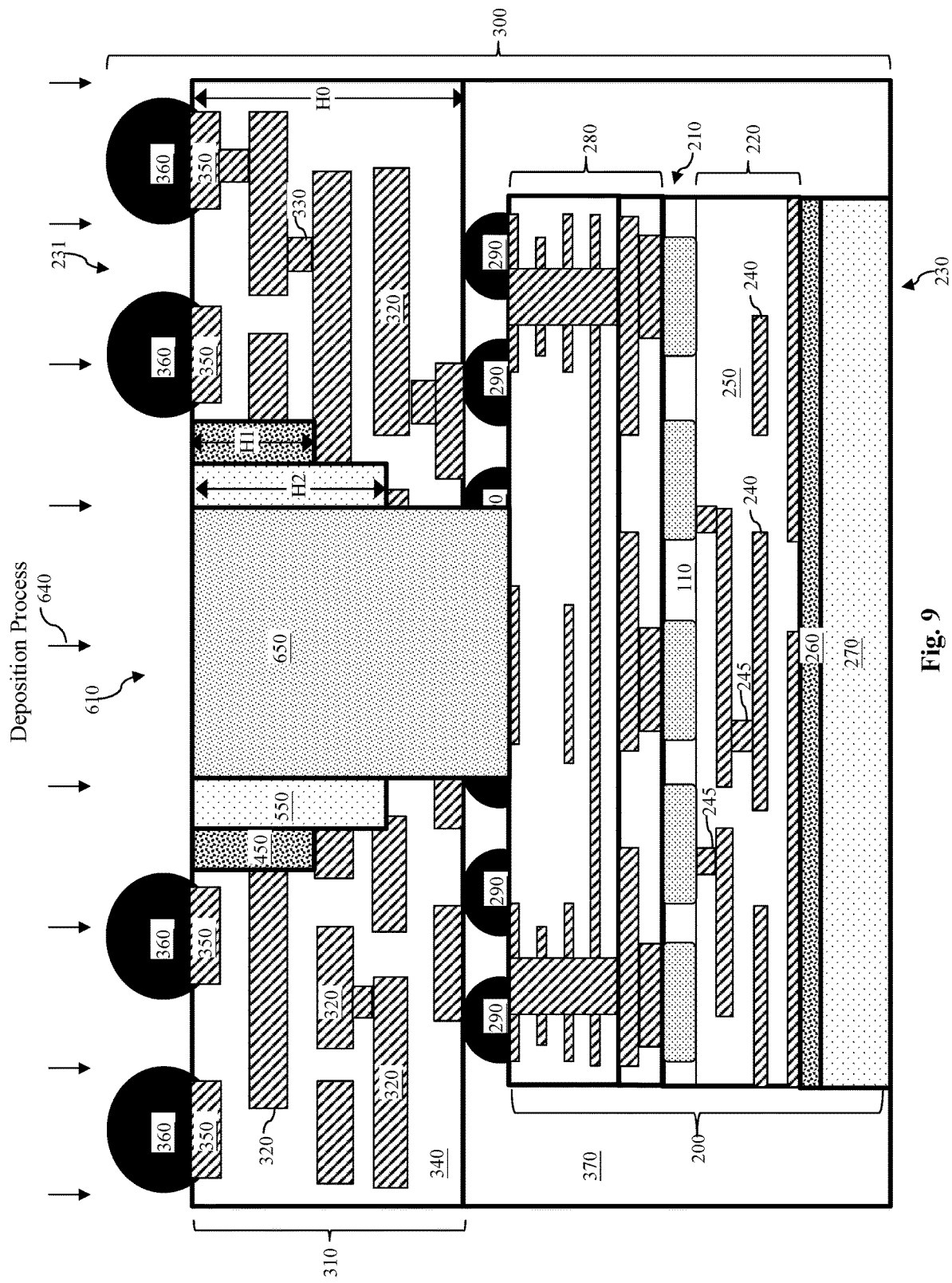

Referring now to FIG. 9, a deposition process 640 is performed to the IC package assembly 300 to fill the trench 610 with a refill material 650. In some embodiments, the refill material 650 includes a non-conductive glue material. In some other embodiments, the refill material 650 includes a dielectric material. In yet other embodiments, the refill material 650 includes an organic material. The refill material 650 will help to protect portions of the substrate 310 from damage caused by additional trench formation processes discussed below.

In some embodiments, the refill material 650 has a same material composition as the refill material 450 or as the refill material 550. In other embodiments, the refill material 650 has a different material composition from at least one of the refill material 450 and the refill material 550. For example, the refill material 650 may be harder than the refill material 550 in some embodiments, or the refill material 650 may have better adhesion than the refill material 550 in other embodiments. In some embodiments, the refill material 450, the refill material 550, and the refill material 650 all have different material compositions from one another. In some embodiments, at least one of the refill materials 450, 550, or 650 may include epoxy resin AB glue, or plastic Ab glue. Epoxy resin AB glue is formed by epoxy resin (component A) and polyfunctional hardener (component B) to get crosslinked and cured. Curing can be achieved at room temperature (e.g., about 25 degrees Celsius). In any case, since the trench 510 is deeper and narrower than the trench 410, and the trench 610 is deeper and narrower than the trench 510, peeling is a greater concern for the refill material 550 than the refill material 450, and peeling is also a greater concern for the refill material 650 than the refill material 550. As such, the refill material 550 may have better adhesion and/or greater hardness than the refill material 450, and the refill material 650 may have better adhesion and/or greater hardness than the refill material 550.

Figure 10:
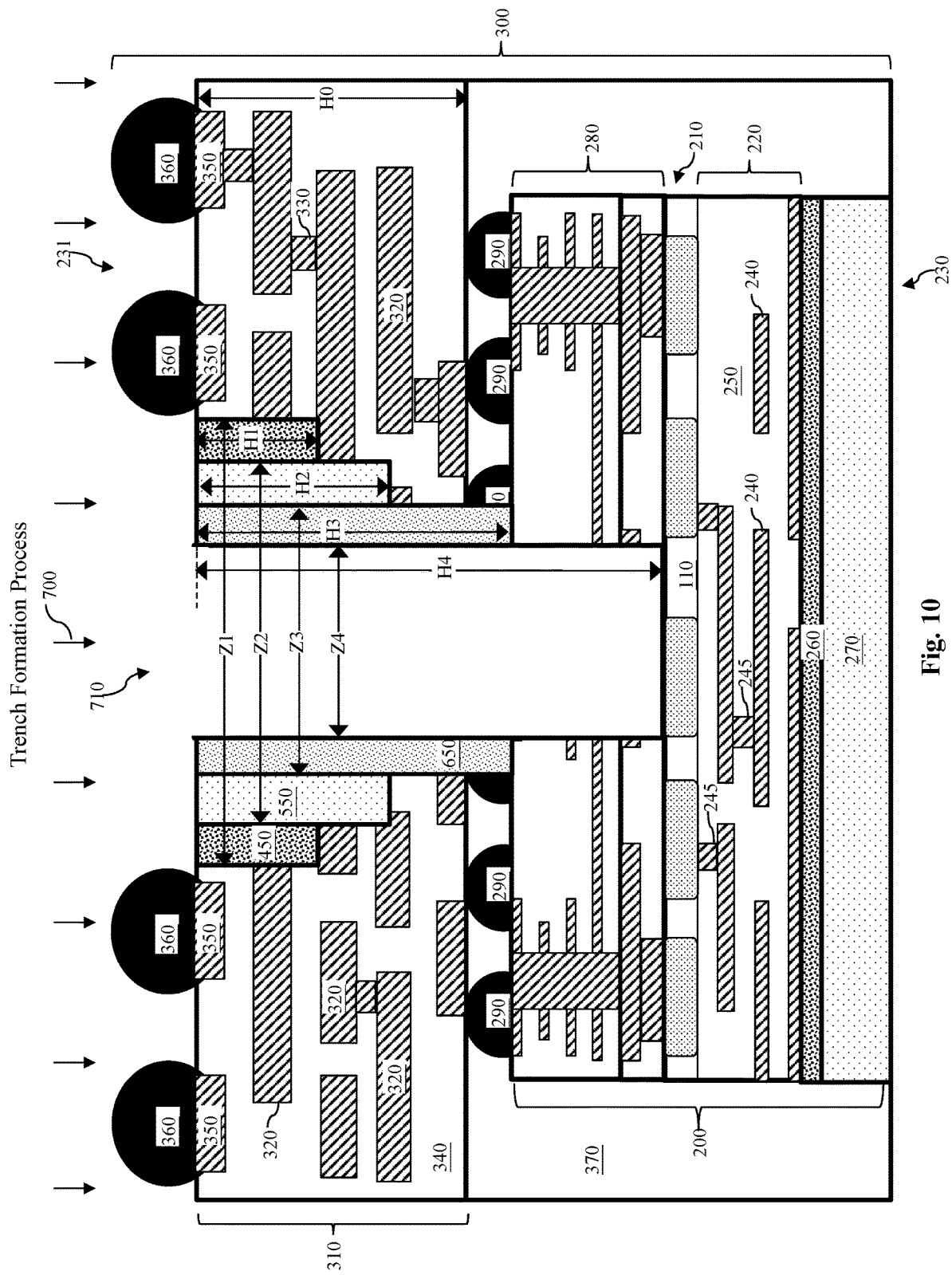

Referring now to FIG. 10, a trench formation process 700 is performed to the IC package assembly 300 to form a trench 710 in the IC package assembly 300. In some embodiments, the trench formation process 700 is also performed using a mechanical drill bit. The trench 710 extends through not only the substrate 310 but also partially into the IC die 200. For example, the trench formation process 700 removes a portion of the PDN 280, such that the trench 710 extends vertically through the PDN 280 from the back side 231 and exposes a target region of the transistors 210. The trench 710 allows electrical signals emitted by the transistors 210 in the region therebelow to propagate through the trench 710 and be picked up by a detection tool as a part of debugging process.

The trench 710 is narrower and deeper than the trench 610 (see FIG. 8). For example, a height H4 of the trench 710 is greater than the height H3 of the trench 610, and the width Z4 of the trench 710 is smaller than the width Z3 of the trench 610. Portions of the refill material 650 remain after the formation of the trench 710, and they partially define the sidewalls of the trench 710. During the trench formation process 700, the remaining portions of the refill material 650 help protect the internal components (e.g., the metal lines 320 and/or the vias 330) of the substrate 310 from potential damage or electrical shorting. Note that since the refill materials 450, 550, and 650 are all electrically non-conductive, their implementation herein may prevent undesirable electrical shorting between various metallization components of the substrate 310.

Figure 11:
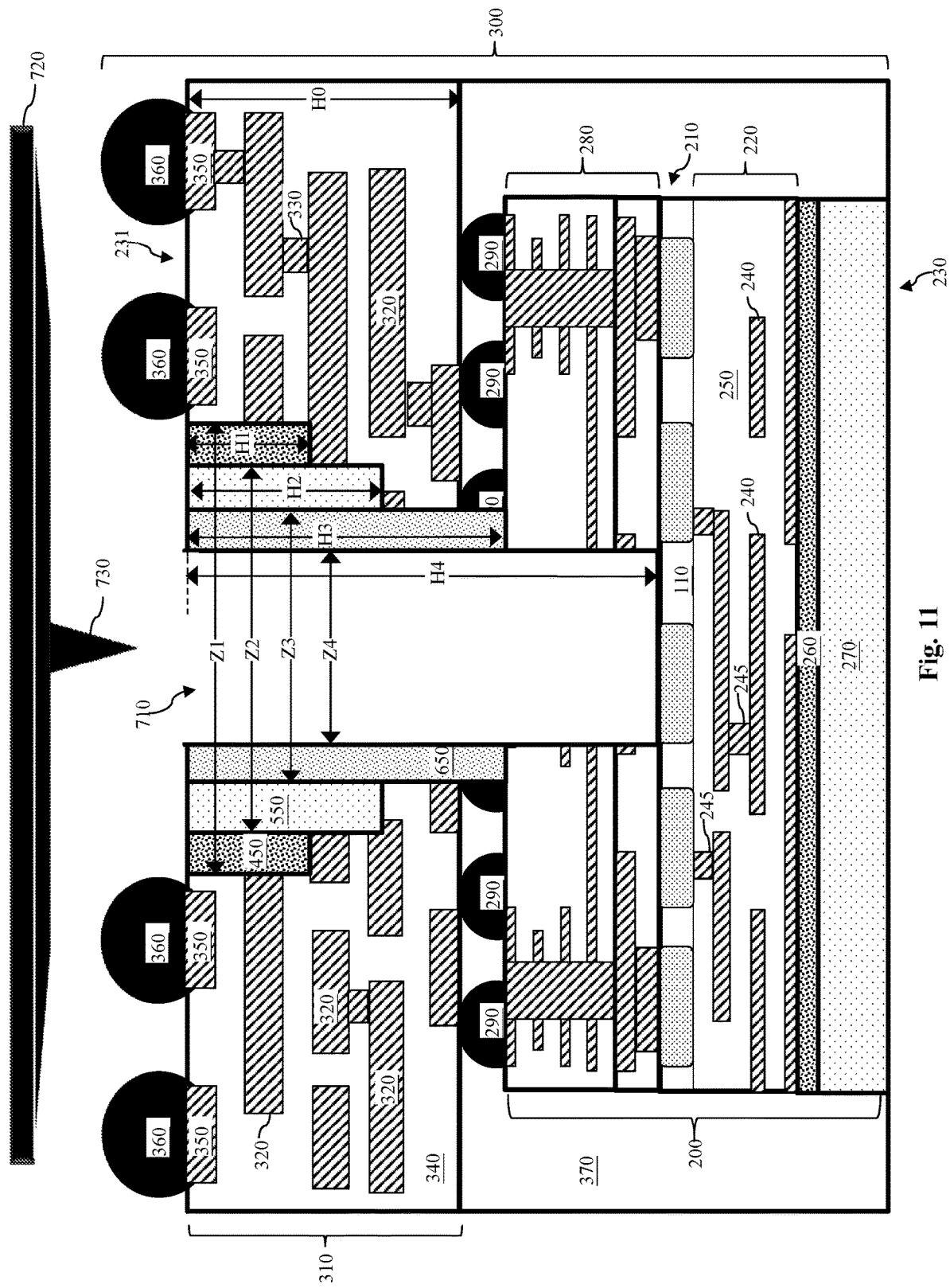

Referring now to FIG. 11, a detection tool 720 is placed over the back side 231 of the IC package assembly 300. The detection tool 720 may be configured to detect signals 730 (which may be electrical signals or optical signals) emitted by the IC die 200. The signals 730 are emitted by the IC die 200, after the IC die 200 receives one or more testing signals from an automated testing equipment (ATE) tool, which forces the IC die 200 to operate in a particular mode. In some embodiments, the detection tool 720 includes an electron beam (e-beam) machine.

The detection tool 720 may analyze the signals 730 and translate them into a plot, a graph, an image, a plurality of numbers, or another suitable analytical result. Based on the analytical result produced by the detection tool 720, a machine or an engineer/technician may identify the portions of the circuitry of the IC die 200 that produced a fault or failure. For example, based on the analytical result, a determination may be made that two transistors in a region A of the IC die 200 that should have been electrically isolated have somehow been electrically shorted together. As another example, based on the analytical result, a determination may be made that a transistor in a region B of the IC die 200 is producing too much, or not enough, electrical current (e.g., greater than or less than a predefined threshold). As yet another example, based on the analytical result, a determination may be made that a microelectronic component (e.g., a source/drain or a gate) in a region C of the IC die 200 is missing or is structurally defective due to a fabrication-related issue. It is understood that these faults discussed above are merely examples and are not intended to be limiting.

Once the faults or their causes/sources have been identified, they can be communicated to appropriate personnel (and/or machines), so that manufacturing processes of the IC package assembly 300 may be adjusted to reduce or eliminate the likelihood of these faults occurring in the future. As a result, device performance and/or yield may be improved. Again, although the presence of metallization components on both the front side 230 and the back side 231 of the IC die 200 herein may complicate the debugging of the IC die 200, the solutions devised by the present disclosure discussed above can sufficiently address the issues that arise. For example, by forming a trench that extends through the metallization components in the PDN 280 of the IC die 200 and the PCB substrate 310, the signals emitted by the IC die 200 during a testing process may be collected by the detection tool 720 without interference from the metallization components. In addition, the multi-step processes of trench formation and refill material deposition allows non-conductive protective layers to be formed on the sidewalls of the trench, which help protect the components of the PCB substrate from potential damage and/or electrical shorting.

It is also understood that, although the metallization components of the PDN 280 have been used as an example components that could be removed to prevent them from blocking the propagation of signals emitted by IC chips during a debugging process, similar concepts may apply to other types of optically opaque and/or electrically non-conductive materials as well. In other words, another type of IC chip may include optically opaque and/or electrically non-conductive materials on both sides. To facilitate the testing of such an IC chip as a part of its debugging process, an opening may be formed to remove a portion of the optically opaque or electrically non-conductive material from one side of the IC chip, so that signals emitted by the IC chip during its testing may still be freely detected by a detection tool through the opening. The multi-step trench formation and deposition processes discussed above may also be used to ensure that the opening formed in the other types of IC chips to protect the IC chips from potential damage.

Figure 12:
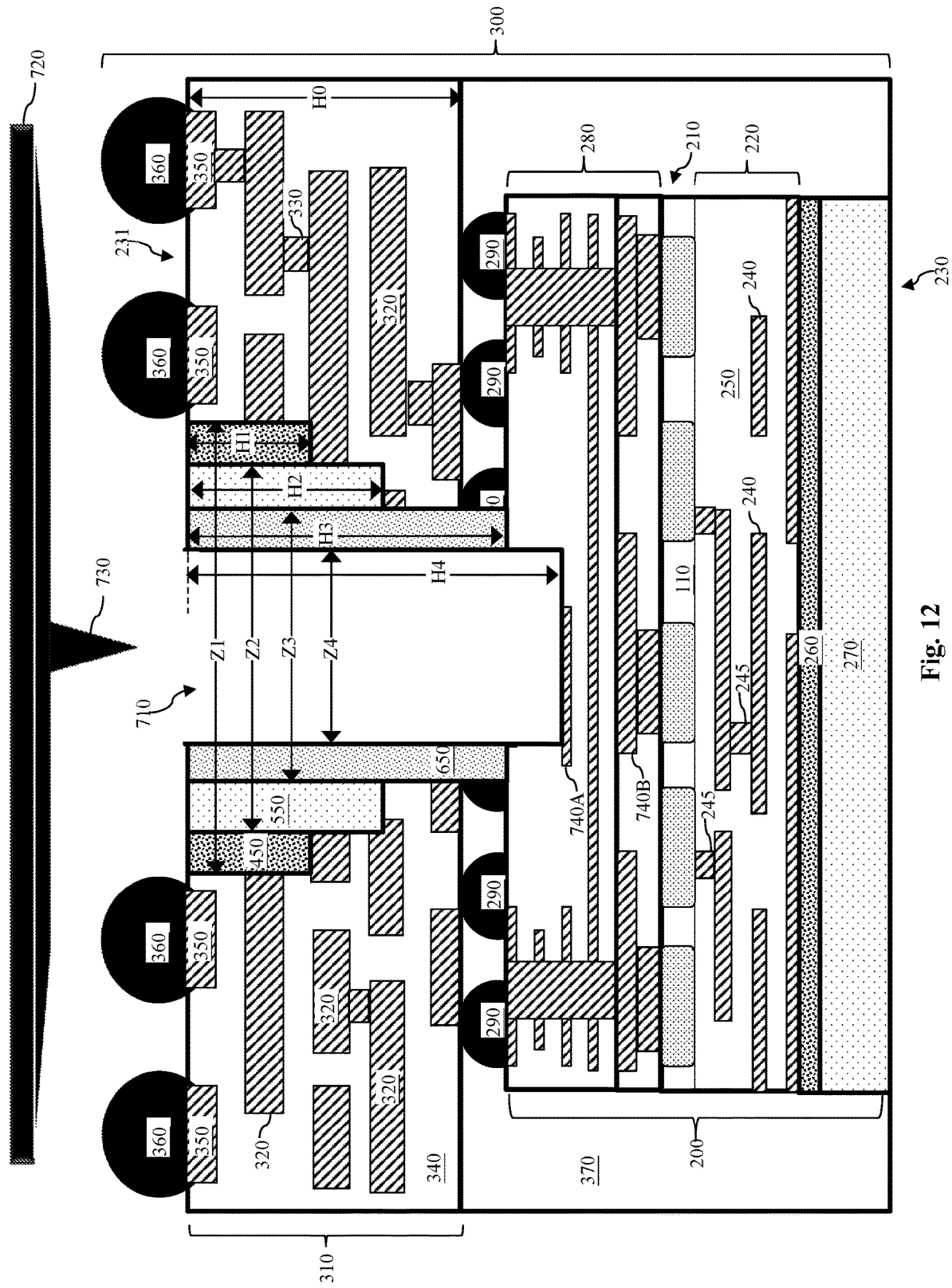

FIG. 12 illustrates an alternative embodiment of the present disclosure. For reasons of consistency and clarity, similar components appearing in FIG. 11 will be illustrated the same in FIG. 12. One difference between the embodiment of FIG. 11 and FIG. 12 is that the trench 710 in FIG. 12 does not extend completely through the PDN 280. Instead, the trench 710 stops at, and exposes, one of the metallization components of the PDN 280. For example, the trench 710 may expose a metal line 740A (which may be an embodiment of a rail of the IC package assembly 300), as shown in the embodiment of FIG. 12. In other embodiments, the trench 710 may expose a metal pad 740B that is physically and electrically coupled to one of the transistors 210 through a via. The signals 730 emitted by the IC die 200 under-test can still be transmitted through the metallization components (e.g., the metal line 740A or the metal pad 740B) of the PDN 280 and propagate out of the trench 710, before being detected by the detection tool 720.

It is also understood that although the embodiments discussed above illustrate one trench 710, other embodiments may implement multiple trenches similar to the trench 710. The multiple trenches may have different depths/height and/or lateral sizes, so that they can be flexibly configured to expose different target regions of the IC die 200 and allow different signals 730 to be detected by the detection tool 720 as a part of the debugging process. It is also understood that although the formation of the trench 710 herein involves four trench formation processes and three deposition processes herein, such a number of trench formation processes or deposition processes is not limiting. In other embodiments, more or fewer than four trench formation processes may be used to form the eventual trench, and more or fewer than three deposition processes may be used to form the protective non-conductive layers (e.g., formed by the remaining segments of the refill materials 450, 550, and 650) on the sidewalls of the trench.

To further illustrate the various aspects of the present disclosure, a top view (also referred to as a planar view) of various components of the present disclosure is illustrated in FIG. 13. In more detail, the top view of FIG. 13 is obtained by looking down from the back side 231. FIG. 13 illustrates portions of the IC package assembly 300, but not the detection tool 720. The illustrated portions of the IC chip include the substrate 310, the conductive bumps 360 located on the back side 231 of the IC package assembly 300, the refill materials 450, 550, and 650, and the trench 710. The trench 710 exposes a portion of the IC die 200 that contains the transistors 210. The trench 710 is circumferentially surrounded by the refill material 650, which is circumferentially surrounded by the refill material 550, which itself is circumferentially surrounded by the refill material 450. As discussed above, the refill materials 450, 550, and 650 may have different depths and/or different material compositions. The refill materials 450, 550, 650 also have widths W1, W2, and W3, respectively. In some embodiments, the W1, W2, and W3 may also be different from one another. The values of the widths W1-W3 may be configured based on the design and fabrication circumstances.

In the embodiment illustrated in FIG. 13, the trench 710 may have a substantially square top view profile. However, such a profile is not limiting. In other embodiments, the trench formation processes 500, 600, and/or 700 may be performed to form a trench having different top view profiles. For example, FIG. 14 illustrates various example top view profiles of different embodiments of the trench 710. In more detail, a trench 710A may have a top view profile resembling a square with rounded corners. A trench 710B may have a top view profile resembling a rectangle. A trench 710C may have a top view profile resembling an oval or an ellipse. A trench 710D may have a top view profile resembling a triangle. A trench 710E may have a top view profile resembling a circle. A trench 710F may have a top view profile resembling a trapezoid. A trench 710G may have a top view profile resembling a hexagon. A trench 710H may have a top view profile that is an arbitrarily shape or a polygon.

FIG. 15 is a graph 750 that illustrates the performance of a first IC chip where its trench through the PCB substrate is not protected by protective layers versus a second IC chip where its trench through the PCB substrate is protected by protective layers (e.g., protective layers formed by the refill materials 450, 550, and 650 discussed above). In more detail, the graph 750 includes a horizontal axis that represents voltage, as well as a vertical axis that represents current. The graph 750 also illustrates a plot 760 that corresponds to the performance of the first IC chip, as well as a plot 770 that corresponds to the performance of the second IC chip. As shown in FIG. 15, the plot 760 has a substantially linear relationship between the voltage and current, which indicates the presence of electrical shorting somewhere on the first IC chip. Such an electrical shorting may have occurred as a result of damage caused to the PCB substrate, since trenches formed in the PCB substrate may cause potential damage or deformation of the metal lines and/or vias therein, which may then short with one another electrically. The electrical shorting within the first IC chip may make the first IC chip behave substantially as a resistor (having a relatively low resistance). The voltage across such a resistor may vary substantially linearly as a function of the current through the resistor, and vice versa. Such a behavior is undesirable for transistors, which are typically designed to act as electronic switches (e.g., conducting electricity when the voltage reaches a certain threshold, but not conducting electricity when the voltage is below the threshold).

In contrast, the plot 770 of the second IC chip demonstrates the desired transistor behavior, as the current is substantially zero until the voltage reaches a certain threshold, and the current ramps up rapidly thereafter. Again, this is because the second chip uses the multi-step trench formation and refill material deposition processes discussed above to insulate and protect its trench sidewalls with the refill materials 450, 550, and 650. The protective layers served by the refill materials 450, 550, and 650 prevent potential damage to the metal lines or vias of the PCB substrate 310 and therefore substantially reduce the likelihood of electrical shorting. In this manner, the performance of the second IC chip can be improved according to the various aspects of the present disclosure.

The IC die 200 (or the IC chip assembly 300) discussed above may be implemented in a variety of IC applications, including memory devices such as Static Random-Access Memory (SRAM) devices. In that regard, FIG. 16 illustrates an example circuit schematic for a single-port SRAM cell (e.g., 1-bit SRAM cell) 800 in which the IC die 200 may be implemented. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node SN1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

FIG. 17 illustrates an integrated circuit fabrication system 900 according to embodiments of the present disclosure, which may be used to fabricate the IC die 200 of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 18 is a flowchart illustrating a method 1000 of packaging and testing an IC package assembly according to various aspects of the present disclosure. The method 1000 includes a step 1010 to provide an integrated circuit (IC) package assembly. The IC package assembly includes: a first substrate containing a plurality of transistors, a first metallization structure disposed over a first side of the first substrate, a second metallization structure disposed over a second side of the first substrate opposite the first side, and a second substrate attached to the second metallization structure.

The method 1000 includes a step 1020 to perform a first trench formation process. The first trench formation process forms a first trench that extends partially through the second substrate from the second side.

The method 1000 includes a step 1030 to perform a first deposition process. The first deposition process fills the first trench with a first non-conductive material.

The method 1000 includes a step 1040 to perform a second trench formation process. The second trench formation process forms a second trench that extends through the first non-conductive material and through the second substrate from the second side. The second trench has a greater depth than the first trench and a smaller width than the first trench.

The method 1000 includes a step 1050 to detect, via a signal detection tool placed on the second side of the IC package assembly, signals emitted by the IC package assembly through the second trench.

The method 1000 includes a step 1060 to identify one or more faults of the IC package assembly based on the detected signals.

In some embodiments, the second trench exposes the transistors or one or more metallization components of the second metallization structure.

In some embodiments, the first deposition process and the second deposition process each deposits a respective glue material as the first non-conductive material and the second non-conductive material.

In some embodiments, the first substrate includes a semiconductor substrate; the first metallization structure includes a multi-layer interconnect structure; the second metallization structure includes a power delivery network (PDN); and the second substrate includes a printed circuit board (PCB) substrate.

It is understood that additional processes may be performed before, during, or after the steps 1010-1060 of the method 1000. For example, in some embodiments, the method 1000 may further include a step of performing a second deposition process. The second deposition process fills the second trench with a second non-conductive material. The first non-conductive material and the second non-conductive materials have different material compositions. As another example, the method 1000 may further include a step of performing a third trench formation process. The third trench formation process forms a third trench that extends through the second non-conductive material and through the second substrate from the second side. The third trench has a greater depth than the second trench and a smaller width than the second trench. As yet another example, the method 1000 may further include a step of performing a third deposition process. The third deposition process fills the third trench with a third non-conductive material. As a further example, the method 1000 may further include a step of performing a fourth trench formation process. The fourth trench formation process forms a fourth trench that extends through the third non-conductive material and through the second substrate from the second side. The fourth trench extends at least partially through the second metallization structure. The fourth trench has a greater depth than the third trench and a smaller width than the third trench.

In summary, the present disclosure pertains to packaging and testing an IC device to facilitate the debugging of the IC device. In more detail, the IC device (e.g., an IC package assembly) herein has metallization components on both its front side and back side. For example, an IC die may have a substrate that contains transistors, an interconnect structure (including multiple metal layers) formed on the front side of the substrate, and a power delivery network (PDN) formed on the back side of the substrate. A printed circuit board (PCB) substrate may be attached to the IC die from the back side to form the IC package assembly. Through multiple trench formation processes, a trench is formed in the PCB substrate from the back side, and the trench also extends at least partially into the PDN. Some of the trench formation processes may be followed by a deposition process to form non-conductive layers on the sidewalls of the trench. As a result, the final trench may have a plurality of non-conductive layers coated on its sidewalls, where the non-conductive layers have different depths. During a debugging process, an automated testing equipment (ATE) tool may feed test signals to the IC device, so that the IC device will operate in a predetermined mode and generate signals accordingly. These signals propagate out of the trench and detected by a signal detection tool placed at the back side of the IC device. Based on an analysis of the detected signals, the source of the faults causing failures of performance issues for the IC device may be identified.

The present disclosure may offer advantages over conventional devices. However, it is understood that not all advantages are discussed herein, different embodiments may offer different advantages, and that no particular advantage is required for any embodiment. One advantage is that the present disclosure facilitates the debugging process in spite of the presence of metallization components on both the front side and the back side of the IC device. In more detail, conventional IC devices may have metallization structures on the front side, but not the back side. As such, the signal detection tool may be placed on the back side of the IC device to detect signals emitted by the IC device under-test. However, such an approach is complicated by the fact that the IC device herein has the PDN and the PCB substrate implemented on the back side. The metallization components of the PDN and the PCB could block the signals emitted by the IC device. One approach is to form a trench through the PCB and the PDN from the back side to allow the signals emitted by the IC device to propagate out of the IC device. However, the trench formation, if done in a single process, may cause damage to the PCB substrate and/or to the PDN. For example, the metallization components of the PCB substrate and/or the PDN may collapse, shift, or otherwise become deformed as a result of the trench formation, which in turn could lead to defects such as electrical shorting.

To address these issues, the present disclosure utilizes multiple cycles of trench formation processes and deposition processes to form the final trench. In each of these cycles, a wider and shallower trench is formed initially and filled by a non-conductive material (e.g., a glue material). Such a trench is replaced by a narrower and deeper trench that extends through the non-conductive material. The non-conductive material formed in each cycle can protect the metallization components of the PCB substrate and/or the PDN from potential damage (e.g., deformation caused by mechanical forces/tools) by the subsequent trench formation processes. The non-conductive materials also protect these metallization components from other undesirable elements such as debris, contaminant particles, and/or moisture. The cycles continue until a final trench can expose target regions of the transistors and/or metallization components of the PDN, which allows the signals emitted by the IC device under-test to transmit therethrough and be detected by the signal detection tool with minimal to no interference. In this manner, accurate debugging can be performed on the IC device. Other advantages may include compatibility with existing fabrication processes and the ease and low cost of implementation.

The advanced lithography process, method, and materials described above can be used in many applications, including in IC devices using fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

One aspect of the present disclosure pertains to an IC chip assembly. The chip assembly includes an integrated circuit (IC) die that includes a first substrate in which plurality of transistors is formed, a first structure that contains a plurality of first metallization components, and a second structure that contains a plurality of second metallization components. The first structure is disposed over a first side of the first substrate. The second structure is disposed over a second side of the first substrate opposite the first side. The chip assembly includes a second substrate bonded to the IC die through the second side. The chip assembly includes a trench that extends through the second substrate and through the second structure of the IC die. Sidewalls of the trench are defined at least in part by one or more protective layers.

Another aspect of the present disclosure pertains to a system. The system includes an integrated circuit (IC) package assembly. The IC package assembly includes a semiconductor substrate containing a plurality of transistors. The IC package assembly includes an interconnect structure disposed over a first side of the semiconductor substrate. The IC package assembly includes a power delivery network (PDN) structure disposed over a second side of the semiconductor substrate opposite the first side. The IC package assembly includes a printed circuit board (PCB) substrate coupled to the PDN structure. A trench extends, from the second side, through the PCB and at least partially into the PDN. The system includes a signal detection tool configured to detect signals emitted by the IC package assembly. The signals propagate out of the trench before being detected by the signal detection tool.

Yet another aspect of the present disclosure pertains to a method. An integrated circuit (IC) package assembly is provided. The IC package assembly includes: a first substrate containing a plurality of transistors, a first metallization structure disposed over a first side of the first substrate, a second metallization structure disposed over a second side of the first substrate opposite the first side, and a second substrate attached to the second metallization structure. A first trench formation process is performed. The first trench formation process forms a first trench that extends partially through the second substrate from the second side. A first deposition process is performed. The first deposition process fills the first trench with a first non-conductive material. A second trench formation process is performed. The second trench formation process forms a second trench that extends through the first non-conductive material and through the second substrate from the second side. The second trench has a greater depth than the first trench and a smaller width than the first trench.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A chip assembly, comprising:
    an integrated circuit (IC) die that includes a first substrate in which plurality of transistors is formed, a first structure that contains a plurality of first metallization components, and a second structure that contains a plurality of second metallization components, wherein the first structure is disposed over a first side of the first substrate, and wherein the second structure is disposed over a second side of the first substrate opposite the first side;
    a second substrate bonded to the IC die through the second side; and
    a trench that extends through the second substrate and through the second structure of the IC die, wherein sidewalls of the trench are defined at least in part by one or more protective layers.

2. The chip assembly of claim 1, wherein:
    the first substrate is a semiconductor substrate; and
    the second substrate is a printed circuit board (PCB) substrate.

3. The chip assembly of claim 1, wherein at least some of the protective layers include a non-conductive glue material.

4. The chip assembly of claim 1, wherein:
    the protective layers include at least a first protective layer having a first height, a second protective layer having a second height, and a third protective layer having a third height;
    the first protective layer is located farthest from the trench;
    the third protective layer is located closest to the trench;
    the second protective layer is located between the first protective layer and the third protective layer;
    the first height is less than the second height; and
    the second height is less than the third height.

5. The chip assembly of claim 4, wherein a height of the trench is greater than the third height.

6. The chip assembly of claim 1, wherein the one or more protective layers have at least two different material compositions.

7. The chip assembly of claim 1, wherein the second metallization components are components of a power delivery network (PDN), and wherein the trench extends vertically at least partially through the PDN from the second side.

8. The chip assembly of claim 7, wherein the trench exposes one of the second metallization components of the PDN.

9. A system, comprising:
    an integrated circuit (IC) package assembly that includes:
        a semiconductor substrate containing a plurality of transistors;
        an interconnect structure disposed over a first side of the semiconductor substrate;
        a power delivery network (PDN) structure disposed over a second side of the semiconductor substrate opposite the first side; and
        a printed circuit board (PCB) substrate coupled to the PDN structure, wherein a trench extends, from the second side, through the PCB and at least partially into the PDN; and
    a signal detection tool configured to detect signals emitted by the IC package assembly, wherein the signals propagate out of the trench before being detected by the signal detection tool.

10. The system of claim 9, wherein:
    the signal detection tool includes an electron beam machine;
    the system further comprises an automated test equipment (ATE) tool configured to supply test signals to the IC package assembly; and
    the IC package assembly, in response to receiving the test signals from the ATE tool, emits the signals detected by the signal detection tool.

11. The system of claim 9, wherein the IC package assembly further includes a plurality of non-conductive layers that extend at least partially through the PCB substrate, and wherein sidewalls of the trench are defined at least partially by one of the non-conductive layers.

12. The system of claim 11, wherein the non-conductive layers have a plurality of different vertical dimensions, respectively.

13. The system of claim 11, wherein the non-conductive layers have different material compositions from one another, and wherein at least one of the non-conductive layers include a glue material.

14. A method, comprising:
   providing an integrated circuit (IC) package assembly that includes: a first substrate containing a plurality of transistors, a first metallization structure disposed over a first side of the first substrate, a second metallization structure disposed over a second side of the first substrate opposite the first side, and a second substrate attached to the second metallization structure;
   performing a first trench formation process, wherein the first trench formation process forms a first trench that extends partially through the second substrate from the second side;
   performing a first deposition process, wherein the first deposition process fills the first trench with a first non-conductive material; and
   performing a second trench formation process, wherein the second trench formation process forms a second trench that extends through the first non-conductive material and through the second substrate from the second side, and wherein the second trench has a greater depth than the first trench and a smaller width than the first trench.

15. The method of claim 14, wherein the second trench exposes the transistors or one or more metallization components of the second metallization structure.

16. The method of claim 14, further comprising:
   detecting, via a signal detection tool placed on the second side of the IC package assembly, signals emitted by the IC package assembly through the second trench; and
   identifying one or more faults of the IC package assembly based on the detected signals.

17. The method of claim 14, further comprising: performing a second deposition process, wherein the second deposition process fills the second trench with a second non-conductive material, wherein the first non-conductive material and the second non-conductive materials have different material compositions.

18. The method of claim 17, wherein the first deposition process and the second deposition process each deposits a respective glue material as the first non-conductive material and the second non-conductive material.

19. The method of claim 17, further comprising, after the second deposition process is performed:
   performing a third trench formation process, wherein the third trench formation process forms a third trench that extends through the second non-conductive material and through the second substrate from the second side, and wherein the third trench has a greater depth than the second trench and a smaller width than the second trench;
   performing a third deposition process, wherein the third deposition process fills the third trench with a third non-conductive material; and
   performing a fourth trench formation process, wherein the fourth trench formation process forms a fourth trench that extends through the third non-conductive material and through the second substrate from the second side, wherein the fourth trench extends at least partially through the second metallization structure, and wherein the fourth trench has a greater depth than the third trench and a smaller width than the third trench.

20. The method of claim 14, wherein:
the first substrate includes a semiconductor substrate;
the first metallization structure includes a multi-layer interconnect structure;
the second metallization structure includes a power delivery network (PDN); and
the second substrate includes a printed circuit board (PCB) substrate.

* * * * *